(12) United States Patent
Kim et al.

(10) Patent No.: US 9,159,745 B2
(45) Date of Patent: Oct. 13, 2015

(54) DISPLAY SUBSTRATE

(75) Inventors: Ki-Won Kim, Suwon-si (KR); Kap-Soo Yoon, Seoul (KR); Do-Hyun Kim, Seongnam-si (KR); Hyun-Jung Lee, Yangju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 1011 days.

(21) Appl. No.: 12/982,406

(22) Filed: Dec. 30, 2010

(65) Prior Publication Data

US 2011/0175082 A1    Jul. 21, 2011

(30) Foreign Application Priority Data

Jan. 15, 2010    (KR) .................. 10-2010-0004021

(51) Int. Cl.
| | | |
|---|---|---|
| H01L 27/12 | (2006.01) | |
| H01L 21/02 | (2006.01) | |
| H01L 27/32 | (2006.01) | |
| H01L 29/66 | (2006.01) | |

(52) U.S. Cl.
CPC ....... *H01L 27/1225* (2013.01); *H01L 21/02565* (2013.01); *H01L 27/3262* (2013.01); *H01L 29/66765* (2013.01)

(58) Field of Classification Search
CPC .............. H01L 29/7869; H01L 27/124; H01L 29/78606; H01L 29/78696; H01L 27/3262; H01L 21/02565; H01L 27/1214; H01L 2924/00; H01L 29/78618; H01L 27/1251; H01L 29/45; H01L 29/4908; H01L 29/41733; H01L 29/458; H01L 51/52
USPC ............ 257/59, 222, 291, E33.064, E51.022
See application file for complete search history.

(56) References Cited

U.S. PATENT DOCUMENTS

| | | | |
|---|---|---|---|
| 8,148,779 B2* | 4/2012 | Jeong et al. ................... 257/347 |
| 8,669,551 B2* | 3/2014 | Kim et al. ...................... 257/43 |
| 2005/0017302 A1 | 1/2005 | Hoffman | |
| 2008/0191204 A1 | 8/2008 | Kim et al. | |
| 2008/0308806 A1* | 12/2008 | Akimoto et al. ................ 257/59 |
| 2009/0180045 A1 | 7/2009 | Yoon et al. | |
| 2009/0230390 A1 | 9/2009 | Gosain et al. | |
| 2009/0236596 A1* | 9/2009 | Itai ................................. 257/43 |

(Continued)

FOREIGN PATENT DOCUMENTS

| | | |
|---|---|---|
| JP | 2003-303969 | 10/2003 |
| JP | 2006-165530 | 6/2006 |

(Continued)

OTHER PUBLICATIONS

Chinese Office Action dated May 30, 2014 issued by the SIPO for Chinese Patent Application No. 201110008745.9 which was filed on Jan. 17, 2011.

*Primary Examiner* — Evan Pert
*Assistant Examiner* — Leslie Pilar Cruz
(74) *Attorney, Agent, or Firm* — H.C. Park & Associates, PLC

(57) ABSTRACT

A display substrate is provided. The display substrate includes a gate interconnection disposed on an insulating substrate, an oxide semiconductor pattern disposed on the gate interconnection and including an oxide semiconductor, and a data interconnection disposed on the oxide semiconductor pattern to interconnect the gate interconnection. The oxide semiconductor pattern includes a first oxide semiconductor pattern having a first oxide and a first element and a second oxide semiconductor pattern having a second oxide.

10 Claims, 18 Drawing Sheets

(56) References Cited

U.S. PATENT DOCUMENTS

2009/0250693 A1 10/2009 Jeong et al.
2010/0181565 A1* 7/2010 Sakata et al. .................... 257/43

FOREIGN PATENT DOCUMENTS

| | | |
|---|---|---|
| JP | 2007-519256 | 7/2007 |
| JP | 2008-199005 | 8/2008 |
| JP | 2009-158940 | 7/2009 |
| JP | 2009-170905 | 7/2009 |
| JP | 2009-231613 | 10/2009 |
| JP | 2009-302520 | 12/2009 |
| JP | 2011-527108 | 10/2011 |
| WO | 2009/034953 | 3/2009 |
| WO | 2010/002608 | 1/2010 |

* cited by examiner

US 9,159,745 B2

1

DISPLAY SUBSTRATE

CROSS REFERENCE TO RELATED APPLICATION

This application claims priority from and the benefit of Korean Patent Application No. 10-2010-0004021, filed on Jan. 15, 2010, which is hereby incorporated by reference for all purposes as if fully set forth herein.

BACKGROUND OF THE INVENTION

1. Field of the Invention

Exemplary embodiments of the present invention relate to a display substrate.

2. Discussion of the Background

In recent years, the demand for the development of large-scale, high-quality display devices has steadily grown. In particular, the demand has been stronger than ever for improving the operating characteristics of thin-film transistors (TFTs) for driving liquid crystal displays (LCDs). LCDs are just one type of a display device. Conventional TFTs include semiconductor patterns formed of hydrogenated amorphous silicon (a-Si:H). However, TFTs formed of a-Si:H generally have low electron mobility.

Techniques for forming semiconductor patterns of an oxide with high electron mobility have been recently developed.

However, oxide semiconductors are likely to generate leakage current due to reactivity with blue light, and the absolute value of a turn-off voltage may increase as the operating of TFTs continue.

SUMMARY OF THE INVENTION

Exemplary embodiments of the present invention provide a display substrate having stable and reliable thin film transistors (TFTs).

Additional features of the invention will be set forth in the description which follows, and in part will be apparent from the description, or may be learned by practice of the invention.

An exemplary embodiment of the present invention discloses a display substrate that comprises a gate interconnection disposed on a substrate, an oxide semiconductor pattern disposed on the gate interconnection and comprising an oxide semiconductor, and a data interconnection disposed on the oxide semiconductor pattern to interconnect the gate interconnection. The oxide semiconductor pattern comprises a first oxide semiconductor pattern comprising a first oxide and a third element, and a second oxide semiconductor pattern comprising a second oxide.

An exemplary embodiment of the present invention also discloses a display substrate that comprises a gate interconnection disposed on a substrate, an oxide semiconductor pattern disposed on the gate interconnection and comprising an oxide semiconductor, and a data interconnection disposed on the oxide semiconductor pattern to interconnect the gate interconnection. The oxide semiconductor pattern comprises a first oxide semiconductor pattern comprising a first oxide and a third element, a second oxide semiconductor pattern comprising a second oxide, and a third oxide semiconductor pattern comprising a third oxide and a fourth element.

An exemplary embodiment of the present invention further discloses a display substrate that comprises a gate interconnection disposed on a substrate, an oxide semiconductor pattern disposed on the gate interconnection and comprising an

2 oxide semiconductor, and a data interconnection disposed on the oxide semiconductor pattern to interconnect the gate interconnection. The oxide semiconductor pattern comprises a first oxide and a third element, and the third element comprises a concentration gradient varying in a direction perpendicular to a surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
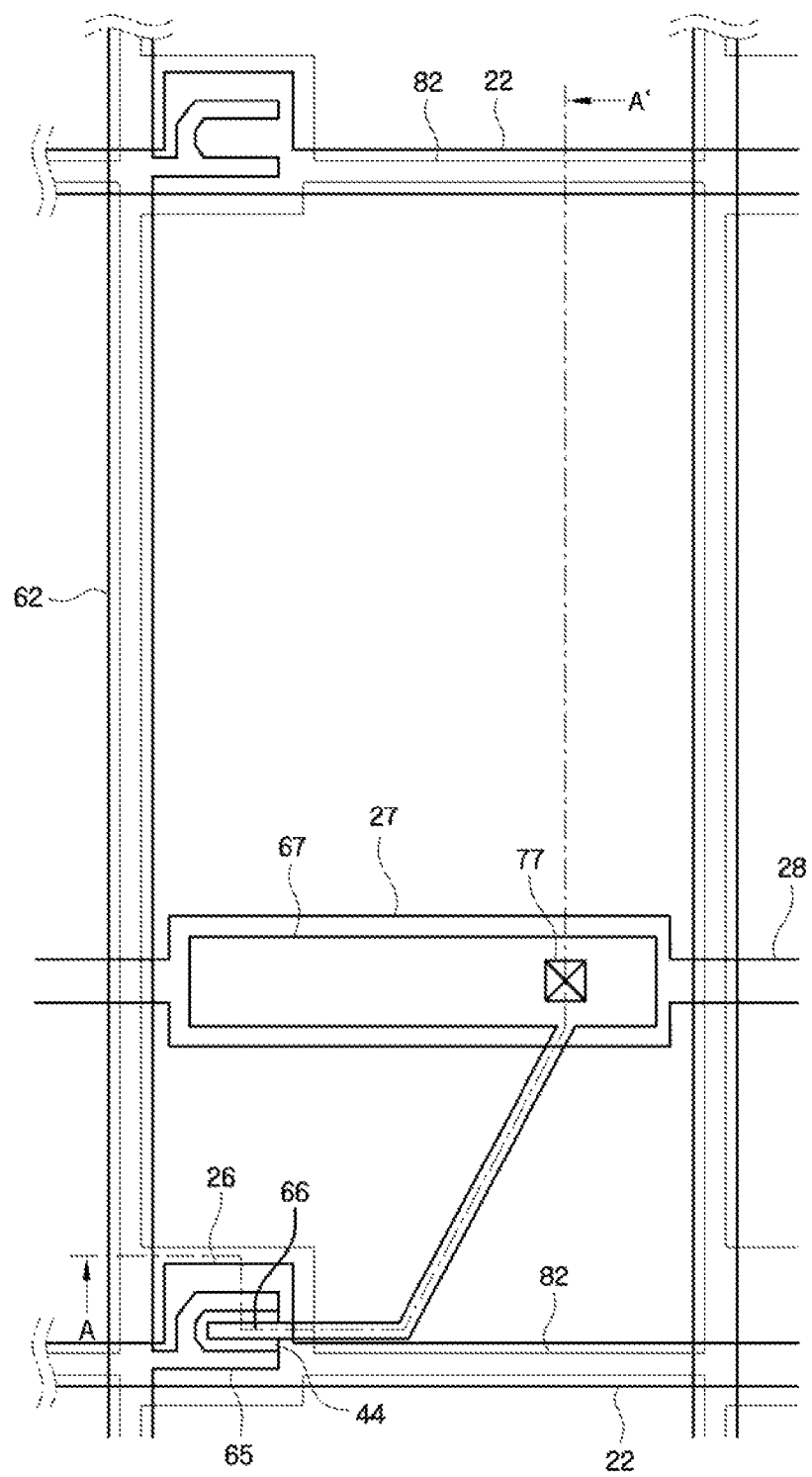
FIG. 1 is a plan view layout of a display substrate according to a first exemplary embodiment of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "under" can encompass both an orientation of above and below. The device may be otherwise oriented and the spatially relative descriptors used herein interpreted accordingly.

Display substrates according to exemplary embodiments of the present invention, display devices including the same, and methods for fabricating the same will hereinafter be described in further detail with reference to the accompanying drawings.

First, a display substrate according to a first exemplary embodiment of the present invention will hereinafter be described with reference to FIG. 1, FIG. 2A, FIG. 2B, FIG. 3A, FIG. 3B, FIG. 3C, FIG. 3D, and FIG. 3E.

Figure 2A:
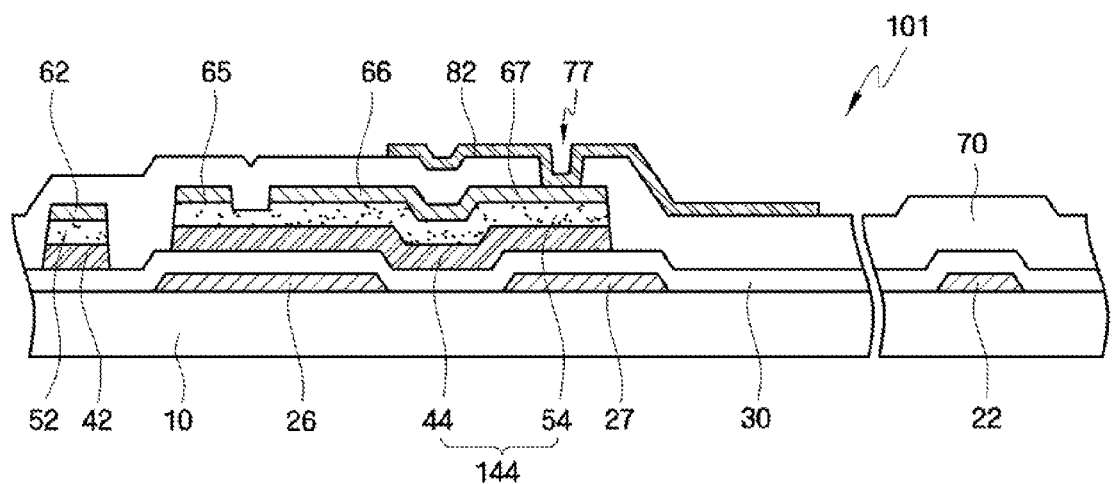
FIG. 2A is a cross-sectional view taken along line A-A' of FIG. 1.
Figure 2B:
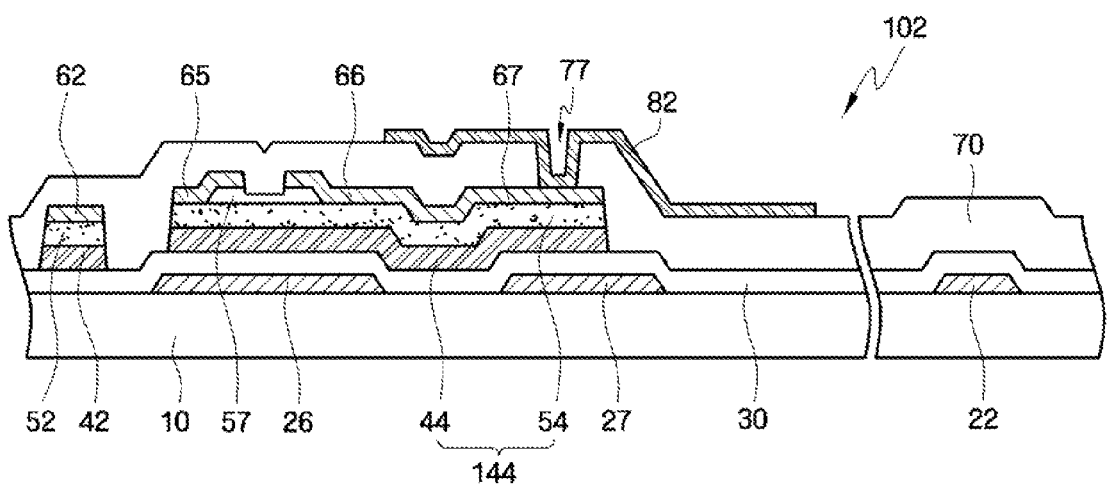
FIG. 2B is a cross-sectional view of a display substrate taken along line A-A' of FIG. 1 according to a first modified exemplary embodiment of the present invention.

FIG. 1 is a plan view layout of a display substrate according to a first exemplary embodiment of the present invention. FIG. 2A is a cross-sectional view taken along line A-A' of FIG. 1, and FIG. 2B is a cross-sectional view of a display substrate taken along line A-A' of FIG. 1 according to a first modified exemplary embodiment of the present invention. FIG. 3A, FIG. 3B, FIG. 3C, FIG. 3D, and FIG. 3E are graphs for explaining certain operating characteristics of a thin film transistor (TFT) of the display substrates shown in FIG. 2A and FIG. 2B.

Referring to FIG. 1 and FIG. 2A, the display substrate 101 includes various elements including TFTs formed on an insulating substrate 10.

The insulating substrate 10 may be made of glass such as soda lime glass or borosilicate glass, plastic, and the like.

A gate interconnection (22 and 26) for transmitting gate signals is formed on the insulating substrate 10. The gate interconnection (22 and 26) includes a gate line 22 formed in one direction on the insulating substrate 10 and a gate electrode 26 of a TFT protruding from the gate line 22.

Storage interconnections (27 and 28) for transmitting a common voltage are also formed on the insulating substrate 10. The storage interconnections (27 and 28) include a storage electrode 27 and a storage electrode line 28. The storage electrode line 28 may be formed substantially parallel to the gate line 22. The storage electrode 27 is connected to the storage electrode line 28, and the storage electrode 27 is wider than the storage electrode line 28. The storage electrode 27 overlaps a drain electrode expansion 67 to which a pixel electrode 82 (to be described later) is connected. The storage electrode 27 and the drain electrode expansion 67 constitute a storage capacitor for improving the charge storage capability of a pixel. The storage electrode 27 and the storage electrode line 28 are collectively referred to as storage interconnections.

The shape and the arrangement of the storage interconnections (27 and 28) may be varied in other embodiments. For example, if the pixel electrode 82 and the gate line 22 generate sufficient storage capacitance by overlapping each other, the storage interconnections (27 and 28) may not be formed.

The gate interconnection (22 and 26) and the storage interconnections (27 and 28) may include a material such as an aluminum (Al)-based metal, e.g., Al or an Al alloy, a silver (Ag)-based metal such as Ag or an Ag alloy, a copper (Cu)-based metal such as Cu or a Cu alloy, a molybdenum (Mo)-based metal such as Mo or an Mo alloy, chromium (Cr), titanium (Ti) or tantalum (Ta). The gate interconnection (22 and 26) and the storage interconnections (27 and 28) may have a multilayered structure including two conductive layers (not shown) having different physical properties. One of the two conductive layers of the gate interconnection (22 and 26) and storage interconnections (27 and 28) may include a metal with low resistivity such as an Al-based metal, an Ag-based metal, or a Cu-based metal and may, thus, be able to reduce a signal delay or a voltage drop. The other conductive layer of the gate interconnection (22 and 26) and the storage interconnections (27 and 28) may include a material having excellent bonding properties to other materials, specifically to zinc oxide (ZnO), indium tin oxide (ITO), or indium zinc oxide (IZO), such as an Mo-based metal, Cr, Ti, or Ta. For example, the gate interconnection (22 and 26) and the storage interconnections (27 and 28) may include a lower layer containing Cr and an upper layer containing Al. Alternatively, the gate interconnection (22 and 26) and the storage interconnections (27 and 28) may include a lower layer made of Al and an upper layer made of Mo, a lower layer made of a CuMn alloy and an upper layer made of Cu, a lower layer made of Ti and an upper layer made of Cu, and other combinations.

A gate-insulating layer 30, which may be made of a dielectric material such as silicon oxide (SiOx) or silicon nitride (SiNx) is formed on the insulating substrate 10, the gate interconnection (22 and 26), and the storage interconnections (27 and 28).

The gate-insulating layer 30 may have a stacked, two-layer structure (not shown) having a silicon nitride (SiNx) layer and a silicon oxide (SiOx) layer. In this case, the silicon nitride (SiNx) layer is formed on the gate interconnection (22 and 26) and the storage interconnections (27 and 28), and the silicon oxide (SiOx) layer is formed on the silicon nitride (SiNx) layer to be in contact with an oxide semiconductor pattern 144, which will be described below. In an alternative embodiment, the gate-insulating layer 30 may have a single-layer structure that may contain a silicon oxynitride (SiON) layer. The silicon oxynitride (SiON) layer may have an oxygen concentration varying according to the stack direction. In this case, the oxygen concentrations may increase as the silicon oxynitride (SiON) layer becomes closer to the oxide semiconductor pattern 144.

The oxide semiconductor pattern 144 is formed on the gate-insulating layer 30. The oxide semiconductor pattern 144 may include a first oxide semiconductor pattern 44 and a second oxide semiconductor pattern 54.

The first oxide semiconductor pattern 44 may include a first oxide and one or more third elements, and the second oxide semiconductor pattern 54 may include a second oxide. Here, the third element may be an element belonging to a group in the periodic table higher than a metal element group in the first oxide. Particularly, the third element may be a Group V-VII element. Examples of the third element include, but are not limited to, nitrogen (N), phosphorus (P), fluorine (F), and chlorine (Cl).

Meanwhile, examples of the first element of the first oxide may include, but are not limited to, zinc (Zn), indium (In), gallium (Ga), tin (Sn), and hafnium (Hf). For example, the first oxide may include one or more of the following oxides: InZnO, InGaO, InSnO, ZnSnO, GaSnO, GaZnO, GaZnSnO, GaInZnO, HfInZnO, and ZnO. Where the third element is, for example, nitrogen (N), the first oxide semiconductor pattern 44 may include one or more of the following oxides: InZnON, InGaON, InSnON, ZnSnON, GaSnON, GaZnON, GaZnSnON, GaInZnON, HfInZnON, and ZnON.

The second oxide semiconductor pattern 54 including the second oxide is formed on the first oxide semiconductor pattern 44. Here, the second oxide may include, but is not limited to, at least one of zinc (Zn), indium (In), gallium (Ga), tin (Sn), and hafnium (Hf). For example, the second oxide may include at least one of InZnO, InGaO, InSnO, ZnSnO, GaSnO, GaZnO, GaZnSnO, GaInZnO, HfInZnO, and ZnO.

The first oxide and the second oxide may include metallic elements of the same group of the periodic table. That is, the second oxide and the first oxide may be made of the same metal. Accordingly, when the first oxide and the second oxide are the same material, the oxide semiconductor pattern 144 may include GaInZnON/GaInZnO.

On the other hand, the first oxide and the second oxide may include metallic elements from different Groups. For example, when the first oxide and the second oxide are different groups from each other, the oxide semiconductor pattern 144 may include HfInZnON/GaInZnO.

Pattern shapes of the first oxide semiconductor pattern (42 and 44), the second oxide semiconductor patterns (52 and 54), and the data interconnections (62, 65, 66, and 67) to be described later may be different or the same. That is, the first oxide semiconductor patterns (42 and 44) and the second oxide semiconductor patterns (52 and 54) may be formed on portions where the gate electrode 26 overlaps the source electrode 65 and the drain electrode 66, giving island type patterns. Alternatively, the first oxide semiconductor patterns (42 and 44) and the second oxide semiconductor patterns (52 and 54) may have linear type shapes, which are substantially the same as the data interconnections (62, 65, 66, and 67) to be described later except for a channel region of an oxide TFT.

Figure 3A:
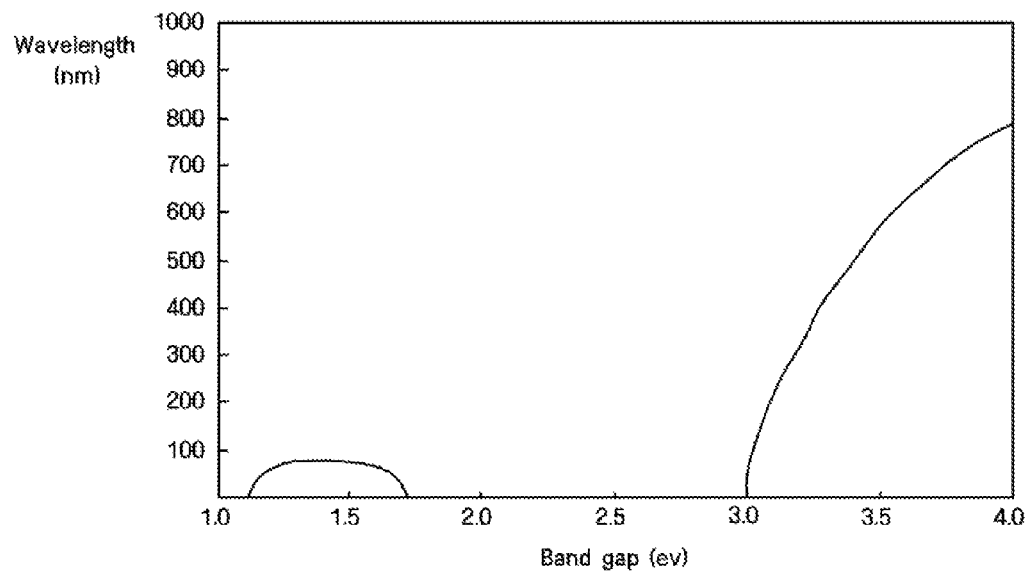
FIG. 3A, FIG. 3B, FIG. 3C, FIG. 3D, and FIG. 3E show graphs for explaining certain operating characteristics of a thin film transistor (TFT) of the display substrates shown in FIG. 2A and FIG. 2B.
Figure 3B:
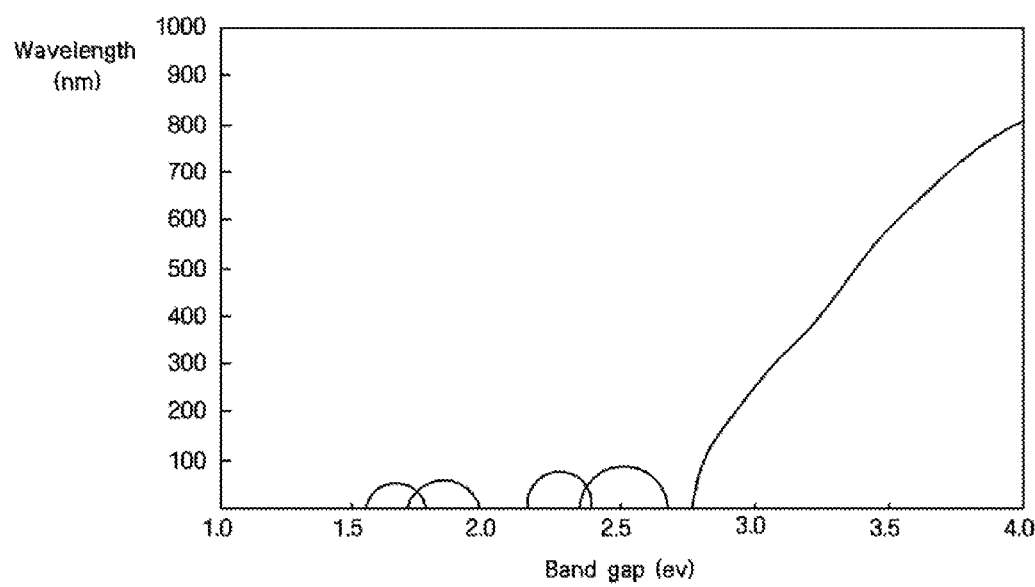

FIG. 3A shows band gaps of the first oxide semiconductor patterns (42 and 44), and FIG. 3B shows band gaps of the second oxide semiconductor patterns (52 and 54).

Referring to FIG. 3A and FIG. 3B, the band gaps of the first oxide semiconductor patterns (42 and 44) are greater than the band gaps of the second oxide semiconductor patterns (52 and 54).

For example, in a case where the first oxide semiconductor patterns (42 and 44) include GaInZnON (to be referred to as GIZON, hereinafter), they have band gaps of approximately 3.0 eV. In a case where the second oxide semiconductor patterns (52 and 54) include GaInZnO (to be referred to as GIZO, hereinafter), they have band gaps of approximately 2.7 eV.

Since the band gaps of the first oxide semiconductor patterns (42 and 44) are greater than the band gaps of the second oxide semiconductor patterns (52 and 54), the absolute value of a turn-off voltage of a TFT included in the display substrate 101 according to the first exemplary embodiment of the present invention may be reduced as a whole. Accordingly, even if the display substrate 101 is continuously driven, the absolute value of a turn-off voltage of the TFT may be prevented from increasing. In addition, current leakage between the source electrode 65 and the drain electrode 66 may be prevented.

Figure 3C:
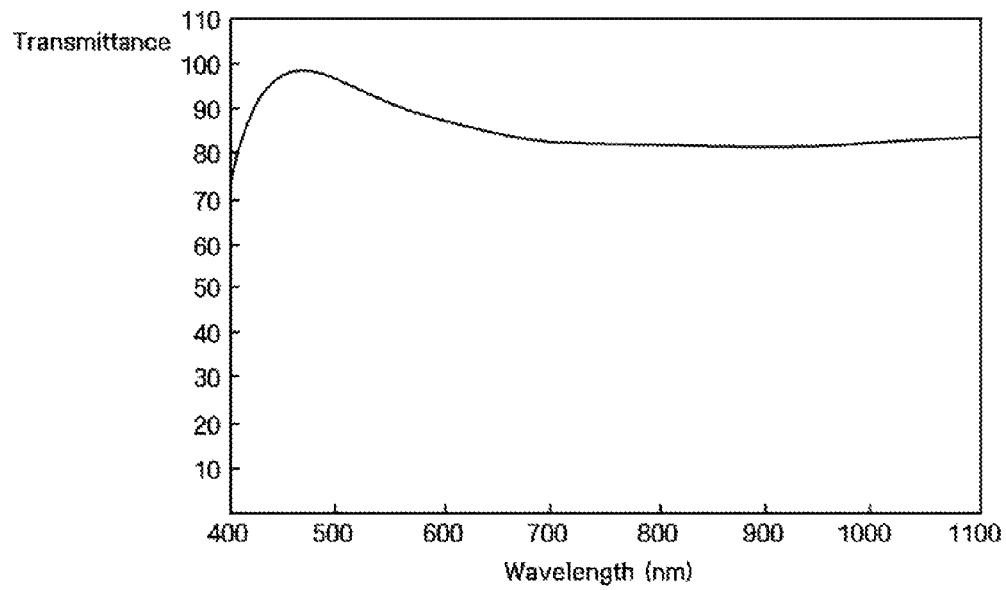

FIG. 3C shows transmittance values where the first oxide semiconductor patterns (42 and 44) include GIZON. Referring to FIG. 3C, GIZON has lower light transmittance in a wavelength range of approximately 400 nm as compared to its transmittance in the visible light wavelength range.

As described above, the first oxide semiconductor patterns (42 and 44) may partially prevent light having a wavelength in a range between 400 nm and 500 nm from being incident into the second oxide semiconductor patterns (52 and 54). That is, the first oxide semiconductor patterns (42 and 44) may prevent visible light in a blue wavelength range from being incident into the second oxide semiconductor patterns (52 and 54). In a case where blue light is incident into the second oxide semiconductor patterns (52 and 54), the second oxide semiconductor patterns (52 and 54) may react with the blue light, forming a channel between the source electrode 65 and the drain electrode 66. Accordingly, even when a turn-on voltage is not applied to the gate electrode 26, leakage current may flow between the source electrode 65 and the drain electrode 66, which may increase the absolute value of the turn-off voltage of the TFT. Therefore, the blue light incident into the second oxide semiconductor patterns (52 and 54) may be blocked by forming the first oxide semiconductor patterns (42 and 44), thereby improving leakage current characteristics with respect to the turn-off voltage of a TFT.

The data interconnections (62, 65, 66, and 67) are formed on the second oxide semiconductor patterns (52 and 54). The data interconnections (62, 65, 66, and 67) include a data line 62, which extends, for example, in a vertical direction, and defines a pixel by crossing the gate line 22; a source electrode 65 that branches from the data line 62 and extends over the second oxide semiconductor patterns (52 and 54); a drain electrode 66, which is separated from the source electrode 65, is formed on the second oxide semiconductor patterns (52 and 54) and faces the source electrode 65 in view of the gate electrode 26 or the oxide TFT channel; and a drain electrode expansion 67, which extends from the drain electrode 66, overlaps the storage electrode 27, and has a relatively large width.

As shown in FIG. 2A, the data interconnections (62, 65, 66 and 67) may be in contact with the second oxide semiconductor patterns (52 and 54) and may, thus, constitute an ohmic contact along with the second oxide semiconductor patterns (52 and 54). For this, the data interconnections (62, 65, 66 and 67) may include a single layer and multiple layer materials such as nickel (Ni), cobalt (Co), Ti, Ag, Cu, Mo, Al, beryllium (Be), niobium (Nb), gold (Au), iron (Fe), selenium (Se), manganese (Mn), or Ta. For example, the data interconnections (62, 65, 66 and 67) may include a double layer of Ta/Al, Ta/Al, Ni/Al, Co/Al, Mo (Mo alloy)/Cu, Mo (Mo alloy)/Cu, Ti (Ti alloy)/Cu, TiN (TiN alloy)/Cu, Ta (Ta alloy)/Cu, TiOx/Cu, Al/Nd, Mo/Nb, or Mn (Mn alloy)/Cu or a triple layer of Ti/Al/Ti, Ta/Al/Ta, Ti/Al/TiN, Ta/Al/TaN, Ni/Al/Ni, or Co/Al/Co. However, the present invention is not restricted to these compositions. Although not shown in FIG. 2A, the data interconnections (62, 65, 66 and 67) may not be in contact with the second oxide semiconductor patterns (52 and 54). In this case, the display device may further include ohmic contact layers (not shown) between the data interconnections (62, 65, 66 and 67) and the second oxide semiconductor patterns (52 and 54).

The source electrode 65 partially overlaps the second oxide semiconductor patterns (52 and 54). The drain electrode 66 also partially overlaps the second oxide semiconductor patterns (52 and 54) and faces the source electrode 65 in view of the oxide TFT channel.

A passivation layer 70 is formed on the data interconnections (62, 65, 66 and 67) and the second oxide semiconductor pattern 54. For example, the passivation layer 70 may include an inorganic material such as silicon nitride (SiNx) or silicon oxide (SiOx), an organic material with excellent planarization properties and photosensitivity, or a dielectric material with a low dielectric constant such as a-Si:C:O or a-Si:O:F obtained by plasma enhanced chemical vapor deposition (PECVD).

The passivation layer 70 may have a multi-layered structure including, but not limited to, a silicon oxide ($SiO_x$) layer and a silicon nitride ($SiN_x$) layer. Here, the silicon oxide ($SiO_x$) layer may be formed on the oxide semiconductor pattern 144, and the silicon nitride ($SiN_x$) layer may be formed on the silicon oxide ($SiO_x$) layer. Since the oxide semiconductor pattern 144 and the silicon oxide ($SiO_x$) layer may be disposed adjacent to each other, deterioration of TFT characteristics of the oxide semiconductor pattern 144 may be prevented.

A contact hole 77 is formed in the passivation layer 70. The drain electrode expansion 67 is exposed through the contact hole 77.

A pixel electrode 82 is formed on the passivation layer 70 and conforms to the shape of a pixel. The pixel electrode 82 electrically connects to the drain electrode expansion 67 through the contact hole 77. The pixel electrode 82 may include a transparent conductive material such as ITO or IZO or a reflective conductive material such as aluminum (Al).

Referring to FIG. 1 and FIG. 2B, a display substrate 102 according to a first modified exemplary embodiment of the present invention has substantially the same configuration as the display substrate 101 according to the first exemplary embodiment of the present invention except that the display substrate 102 includes an etch stop pattern 57 formed on a second oxide semiconductor pattern 54. In FIG. 1 and FIG. 2B, various functional components corresponding to those of the first exemplary embodiment are denoted by the same reference numerals, and, thus, detailed descriptions thereof will be omitted.

The etch stop pattern 57 may include, for example, silicon oxide ($SiO_x$) or silicon nitride ($SiN_x$). The etch stop pattern 57 may be formed at a position corresponding to a channel portion of the second oxide semiconductor pattern 54. Accordingly, it is possible to prevent a portion of the second oxide semiconductor pattern 54 from being over-etched when the source electrode 65 and the drain electrode 66 are formed, thereby preventing characteristics of the oxide TFT from being deteriorated. The etch stop pattern 57 is exposed by the source electrode 65 and the drain electrode 66.

Now, the characteristics of oxide TFTs included in the display substrates 101 and 102 according to the first exemplary embodiment and the first modified exemplary embodiment of the present invention will be described.

Figure 3D:
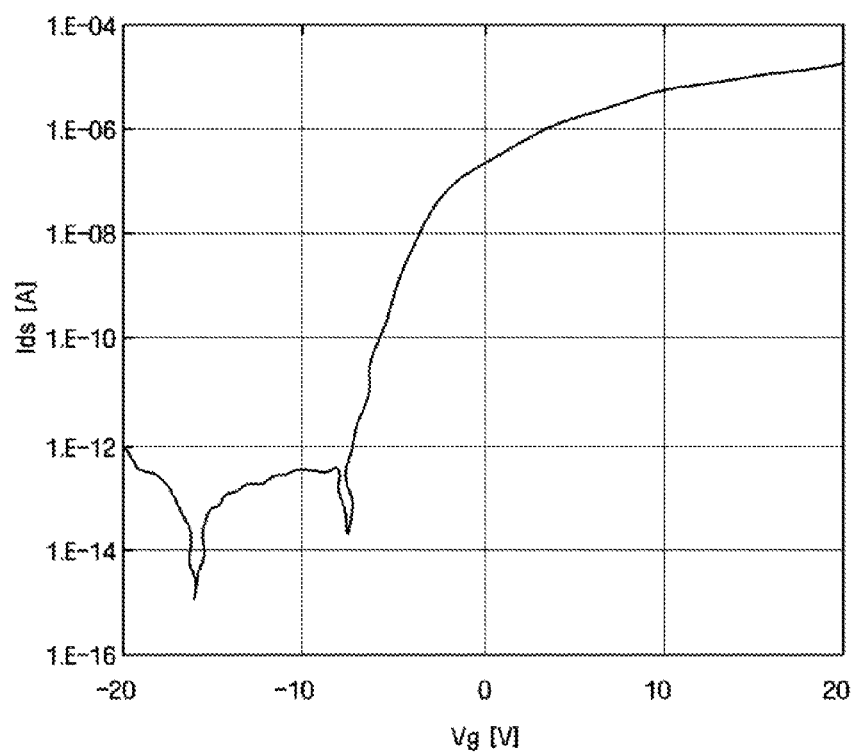
Figure 3E:
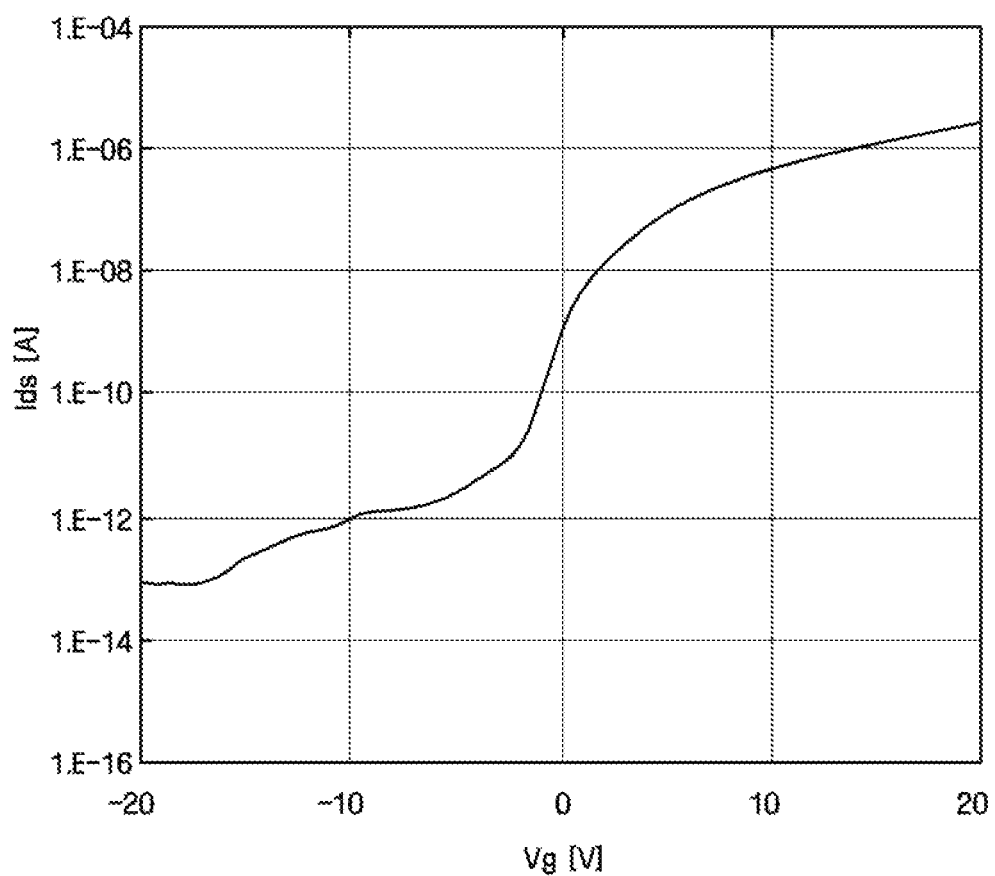

FIG. 3D and FIG. 3E are graphs showing measured data for drain-source current (Ids) for a range of gate voltages after a predetermined voltage is applied to a source electrode. In detail, FIG. 3D shows test results of a TFT without the first oxide semiconductor pattern 44, and FIG. 3E shows test results of TFTs of the display substrates 101 and 102 according to the first exemplary embodiment and the first modified exemplary embodiment of the present invention.

As shown in FIG. 3D and FIG. 3E, when the drain-source current Ids is 1 nA, gate voltages (to be referred to as turn-on voltages, hereinafter) are compared as follows. The TFT without the first oxide semiconductor pattern 44 is turned on around −8 V (see FIG. 3D.), while the TFT with the first oxide semiconductor pattern 44 is turned on around 0 V (see FIG. 3E.). Therefore, where the first oxide semiconductor pattern 44 is included in the TFT, a turn-on voltage value is shifted in a positive direction so that the absolute value thereof may decrease as compared with a case where the first oxide semiconductor pattern 44 is not included in the TFT. Accordingly, the operating voltage range of a TFT may be reduced, and power consumption may also be reduced. In addition, when the turn-on voltage is greater than or equal to 0 V, deterioration in display quality, such as a missing color component, may be suppressed by forming the TFT using an oxide semiconductor. Further, an amorphous silicon gate (ASG) may be formed using an oxide semiconductor.

Next, display devices including the display substrates according to the first exemplary embodiment and the first modified exemplary embodiment of the present invention will be described with reference to FIG. 1, FIG. 4A, and FIG. 4B.

Figure 4A:
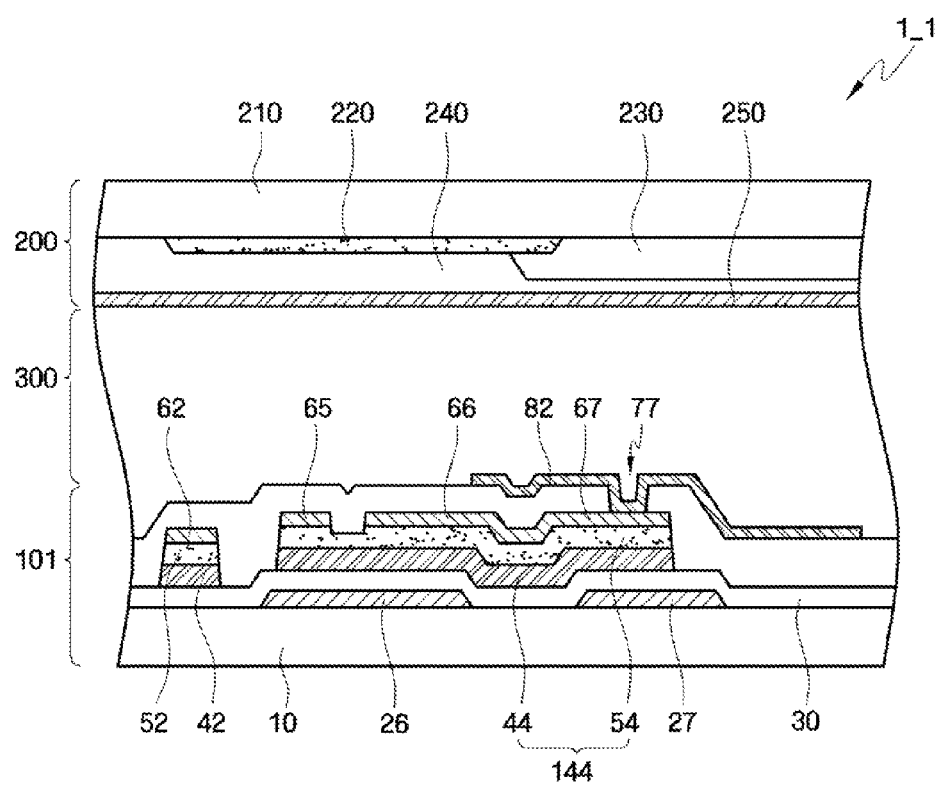
FIG. 4A is a cross-sectional view of a display device including the display substrate taken along line A-A' of FIG. 1 according to the first exemplary embodiment of the present invention.
Figure 4B:
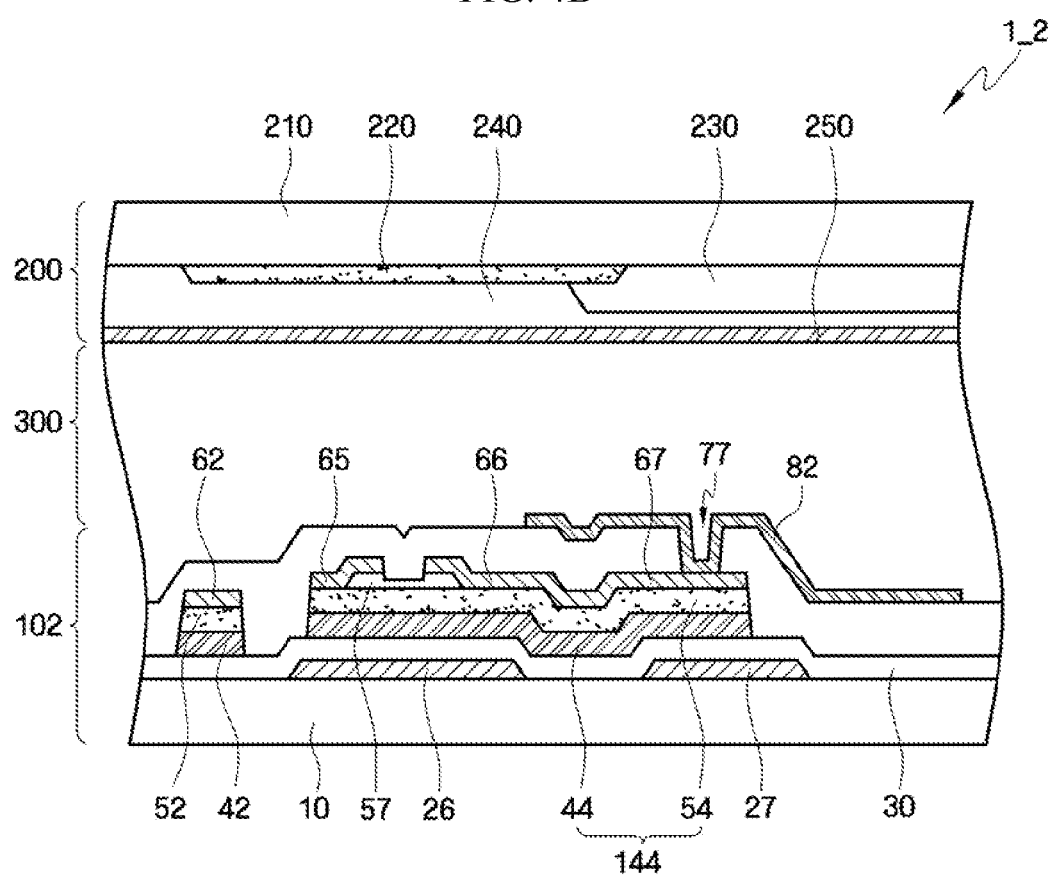
FIG. 4B is a cross-sectional view of a display device including the display substrate taken along line A-A' of FIG. 1 according to the first modified exemplary embodiment of the present invention.

FIG. 4A and FIG. 4B are cross-sectional views of display devices including the display substrates taken along line A-A' of FIG. 1 according to the first exemplary embodiment and the first modified exemplary embodiment of the present invention.

Referring to FIG. 4A, a display device 1_1 according to a second exemplary embodiment of the present invention may include a first display substrate 101, a second display substrate 200, and a liquid crystal layer 300. Here, the first display substrate 101 is substantially the same as the display substrate according to the first exemplary embodiment of the present invention, and repetitive explanation will be omitted.

The second display substrate 200 will be described in further detail. A black matrix 220, which prevents light leakage, is formed on an insulating substrate 210. The black matrix 220 may be formed on the entire surface of the insulating substrate 210 except for portions corresponding to the pixel electrode 82 and may, thus, define a pixel region. The black matrix 220 may include an opaque organic material or an opaque metal but is not restricted thereto.

A color filter 230 is formed on the insulating substrate 210. In order to render a color in the display, the color filter 230 may include red, green, or blue color filters. The color filter 230 may be colored red, green, or blue and thus may be able to render red, green, or blue colors by transmitting or absorbing red light, green light, or blue light. The color filter 230 may render various colors by mixing red light, green light, and blue light using an additive color mixing method.

An overcoat layer 240 is formed on the black matrix 220 and the color filter 230. The overcoat layer 240 reduces the step difference between the black matrix 220 and the color filter 230. The overcoat 240 may include a transparent organic material. The overcoat 240 may be provided for protecting the color filter 230 and the black matrix 220 and for insulating the color filter 230 and the black matrix 220 from a common electrode 250 to be described later.

The common electrode 250 is formed on the overcoat layer 240. The common electrode 250 may include a transparent conductive material such as indium tin oxide (ITO) or indium zinc oxide (IZO) but is not restricted thereto.

The liquid crystal layer 300 is interposed between the first display substrate 101 and the second display substrate 200. The transmittance of the liquid crystal layer 300 varies according to a voltage difference between the voltage of the pixel electrode 82 and the voltage of the common electrode 250.

Referring to FIG. 4B, the display device 1_2 according to the first modified exemplary embodiment of the present invention includes the first display substrate 102, the second display substrate 200, and the liquid crystal layer 300. For sake of clarity and ease of explanation, components having the same function in multiple drawings for describing the first modified exemplary embodiment are identified by the same reference numerals, and their repetitive description will be omitted.

The first display substrate 102 of the display device 1_2 according to the first modified exemplary embodiment of the present invention has substantially the same configuration as the display substrate 101 according to the first exemplary embodiment except that display device 1_2 additionally includes an etch stop pattern 57 formed on a second oxide semiconductor pattern 54.

Next, methods of fabricating the display substrates according to the first exemplary embodiment and the first modified exemplary embodiment of the present invention will be described with reference to FIG. 1, FIG. 2A, FIG. 2B, FIG. 5, FIG. 6, FIG. 7, FIG. 8, FIG. 9, FIG. 10, FIG. 11, FIG. 12, FIG. 13, FIG. 14, FIGS. 15, FIG. 16, FIG. 17, FIG. 18, FIG. 19, FIG. 20, FIG. 21, FIG. 22, FIG. 23, and FIG. 24. In the following embodiments, for sake of clarity and ease of explanation, the same reference numerals will be used to refer to the same or like parts as those described in the first exemplary embodiment and repetitive explanation concerning the above described elements will be omitted or simplified.

FIG. 5, FIG. 6, FIG. 7, FIG. 8, FIG. 9, FIG. 10, FIG. 11, FIG. 12, FIG. 13, and FIG. 14 are cross-sectional views showing processing steps in a method of fabricating the display substrate according to the first exemplary embodiment of the present invention, and FIG. 15, FIG. 16, FIG. 17, FIG. 18, FIG. 19, FIG. 20, FIG. 21, FIG. 22, FIG. 23, and FIG. 24 are cross-sectional views showing processing steps in a method of fabricating the display substrate according to the first modified exemplary embodiment of the present invention.

Figure 5:
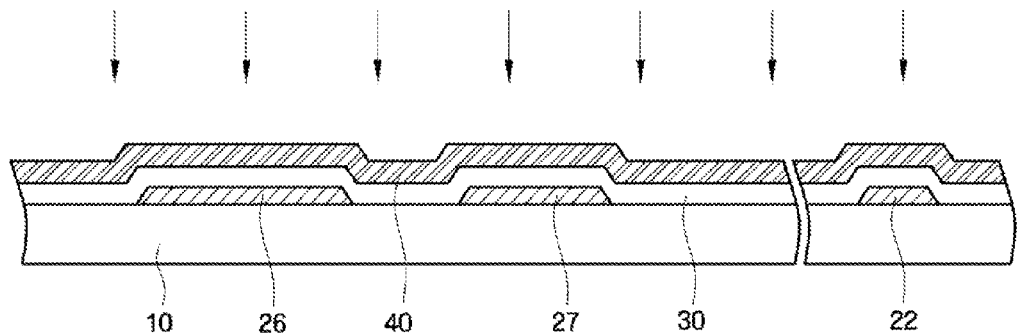
FIG. 5, FIG. 6, FIG. 7, FIG. 8, FIG. 9, FIG. 10, FIG. 11, FIG. 12, FIG. 13, and FIG. 14 are cross-sectional views showing processing steps in a method of fabricating the display substrate according to the first exemplary embodiment of the present invention.

Referring first to FIG. 2A and FIG. 5, a metal layer (not shown) for forming the gate interconnection (22, 26) and the storage interconnections (27 and 28) is deposited on an insulating substrate 10 and patterned, thereby forming the gate interconnection (22, 26) including a gate line 22 and a gate electrode 26 and the storage interconnections (27 and 28) including a storage electrode 27, and a storage line 28. Here, a sputtering method may be used to form the gate interconnection (22, 26) and the storage interconnections (27 and 28).

A gate insulating layer 30 is deposited on the insulating substrate 10, the gate interconnection (22 and 26), and the storage interconnections (27 and 28), for example, by using a PECVD method or a reactive sputtering method.

The sputtering method may be performed at a low temperature of 200 r or less. The gate interconnection (22, 26, 27, 28) formed by the low-temperature sputtering method may prevent deterioration of the insulating substrate 10 made of, for example, soda lame glass. Next, conductive layers may be patterned using a wet etching method or a dry etching method. In using a wet etching method, the wet etchant may be an oxidizing acid such as phosphoric acid, nitric acid, or acetic acid.

Thereafter, a gate insulating layer 30 is deposited on the insulating substrate 10, the gate interconnection (22, 26), and the storage interconnections (27 and 28) by, for example, PECVD or reactive sputtering. The gate insulating layer 30 may be made of silicon nitride (SiNx), silicon oxide (SiOx), silicon oxynitride (SiON), or silicon oxycarbide (SiOC) and may be formed by PECVD. For example, the gate insulating layer 30 may be made of silicon nitride (SiNx), silicon oxide (SiOx), or silicon oxynitride (SiON) and may be formed by reactive sputtering. When the reactive sputtering is performed, nitrogen ($N_2$), oxygen ($O_2$), or a mixture thereof may be used as a reactant gas. For example, an inert gas such as argon (Ar) may be used as a mixing gas.

Next, a first oxide semiconductor layer 40 nay be formed by depositing a first oxide on the gate insulating layer 30 by, for example, reactive sputtering. The process forming the first oxide semiconductor layer 40 may use a mixed gas of Ar, $O_2$, and $N_2$ as a sputtering gas mixture. In this case, a partial pressure of $N_2$ in a chamber may range between 10 to 80%. If the partial pressure of $N_2$ exceeds 80%, contact resistance of forming layers may increase. On the other hand, if the partial pressure of $N_2$ is lower than 10%, a band gap difference between the first oxide semiconductor pattern 44 and the second oxide semiconductor pattern 54 may be negligible.

Figure 6:
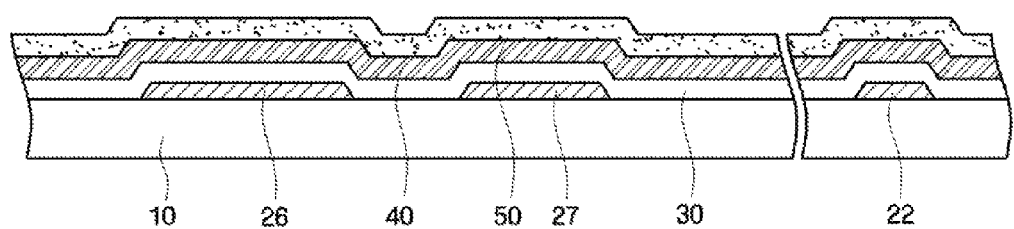

Referring to FIG. 2A and FIG. 6, a second oxide semiconductor layer 50 is formed by depositing a second oxide on the first oxide semiconductor layer 40 by, for example, reactive sputtering. When the sputtering is performed, the chamber may include Ar and $O_2$ as the sputtering gas mixture. In this case, a partial pressure of $O_2$ in a chamber may be in a range between 7 to 70%. If the partial pressure of $O_2$ exceeds 70%, charge mobility of an oxide active layer pattern (52, 54) may decrease. On the other hand, if the partial pressure of $O_2$ is lower than 7%, a conducting property may be imparted to the oxide active layer pattern (52, 54). Meanwhile, the first oxide semiconductor layer 40 and the second oxide semiconductor layer 50 may be formed within the same chamber. Accordingly, the processing time and costs may be reduced.

Figure 7:
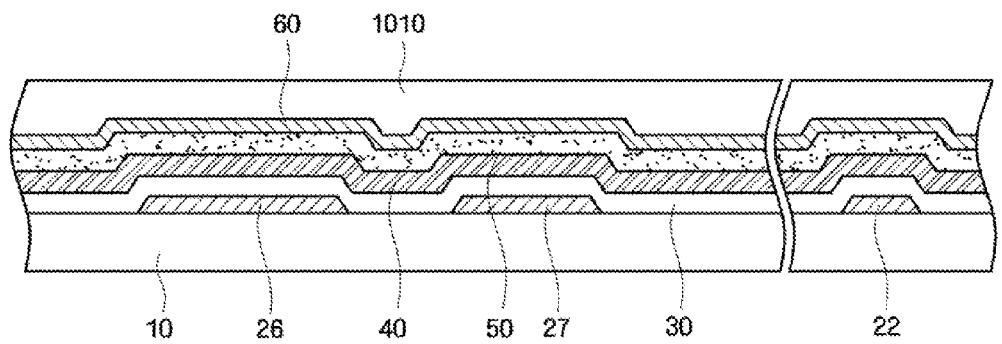

Referring to FIG. 7, a conductive layer 60 for forming the data interconnections is deposited, for example, using a sputtering method, on the second oxide semiconductor layer 50. Thereafter, a photoresist layer 1010 is coated on the conductive layer 60.

Figure 8:
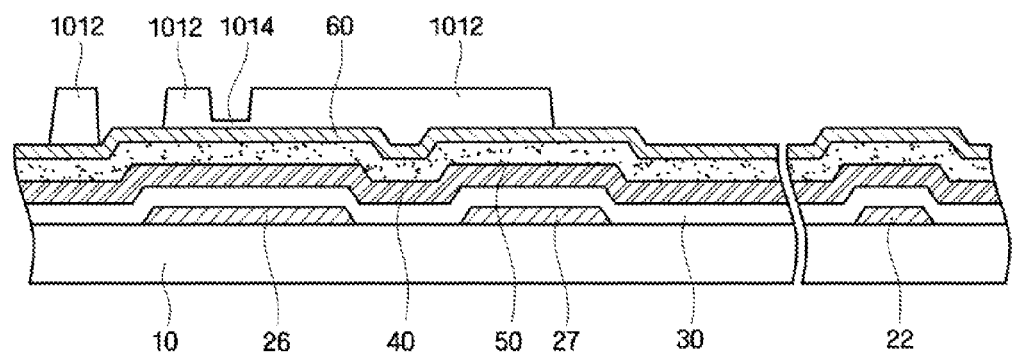

Next, referring to FIG. 8, light is irradiated into the photoresist layer 1010 using a mask followed by developing, thereby forming photoresist layer patterns 1012 and 1014. Here, the photoresist layer pattern 1014 position corresponds to a channel portion of a TFT, that is, the photoresist pattern 1014 occurs between a source electrode (65 of FIG. 11) and a drain electrode (66 of FIG. 11) and is formed to be thinner than the photoresist layer pattern 1012 positioned at regions that may correspond to the data interconnections, that is, potential areas where the data interconnections may be formed. The photoresist layers remaining on areas other than the channel portion and the data interconnections portion are removed. Here, a thickness ratio of the photoresist layer pattern 1014 remaining in the channel portion and the photoresist layer pattern 1012 remaining in the data interconnections portion may be different depending on processing conditions in an etching process to be described later.

As described above, the thickness of the photoresist layer 1010 may vary in many ways according to the position of the photoresist layer. In order to adjust the amount of light transmitted, a slit, a lattice-type pattern, or a translucent film may be used as the mask. Alternatively, the relatively thin photoresist layer pattern 1014 may be formed such that a photoresist layer made of a reflowable material is exposed using a common mask divided into a light transmitting portion and a non-transmitting portion, developed, and reflowed to allow a portion of the photoresist layer to flow to portions where the photoresist layer does not remain.

Figure 9:
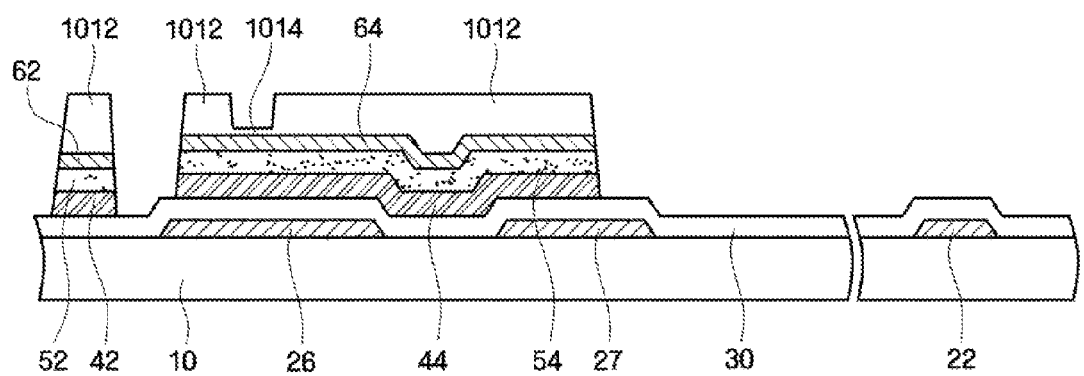
Figure 10:
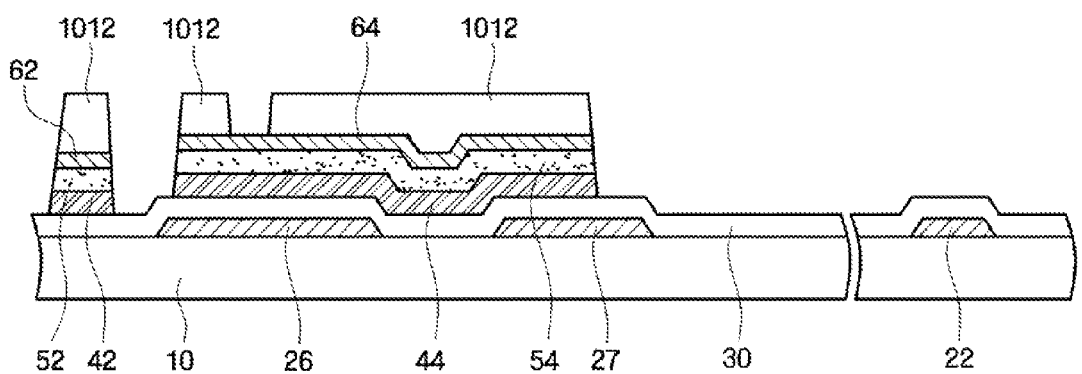

Referring to FIG. 8 and FIG. 9, the conductive layer 60 for forming data interconnections is etched using the photoresist layer patterns 1012 and 1014 as etch masks. The etching may be either wet etching or drying etching. In wet etching, a mixed solution of phosphoric acid, nitric acid, or acetic acid may be used as an etchant. With etching, the conductive layer 60 is completely removed in portions other than a conductive layer pattern 64 for forming a data line 62, a source electrode 65, and a drain electrode 66. Here, the conductive layer pattern 64 for forming the data line 62, a source electrode 65, and a drain electrode 66 has substantially the same configuration as data interconnections (62, 65, 66, and 67 of FIG. 2), except that the conductive layer pattern 64 is not separated from a source electrode (65 of FIG. 11) and a drain electrode (66 of FIG. 11) but is connected thereto.

Referring to FIG. 8, FIG. 9, FIG. 10, and FIG. 11, the second oxide semiconductor layer 50 and the first oxide semiconductor layer 40 exposed between the photoresist patterns 1012 are simultaneously etched. As a result, the first and second oxide semiconductor patterns (42, 44, 52, and 54) are formed; therefore, the first oxide semiconductor patterns 42 and 44 may be made of the same material but is not limited thereto. Likewise, the second oxide semiconductor patterns 52 and 54 may be made of the same material but is not limited thereto. Thereafter, the photoresist layer patterns 1012 and 1014 are etched back, thereby removing the photoresist layer pattern 1014 corresponding to a prospective channel portion of a TFT. Subsequently, the conductive layer pattern 64 is wet-etched or dry-etched using the photoresist layer pattern 1012 as an etch mask. In using wet etching, a mixed solution of phosphoric acid, nitric acid or acetic acid, or a solution of hydrofluoric acid (HF) and deionized water may be used as an etchant. In such a manner, the conductive layer pattern 64 between the photoresist layer patterns 1012 is removed to separate the source electrode 65 from the drain electrode 66, thereby completing the data interconnections (62, 65, 66, and 67). During the etching, a portion of the second oxide semiconductor pattern 54 in the channel portion may also be etched. The source electrode 65 and the drain electrode 66 are spaced apart from and face each other. In addition, the source electrode 65 and the drain electrode 66 expose a portion of the channel portion of the second oxide semiconductor pattern 54.

Figure 11:
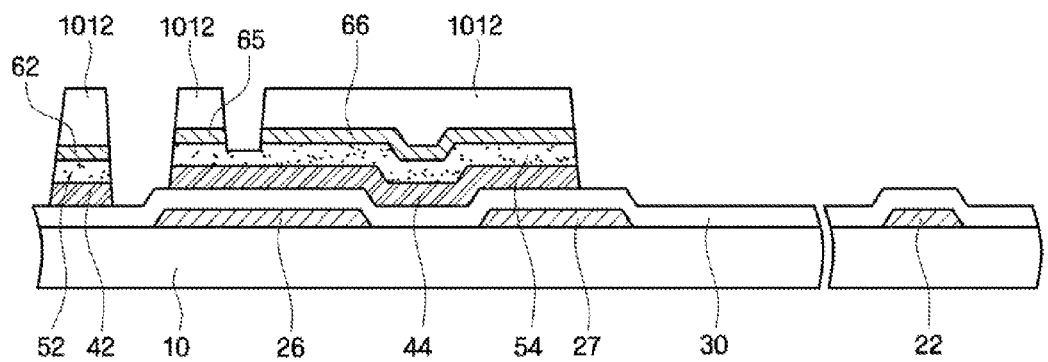
Figure 12:
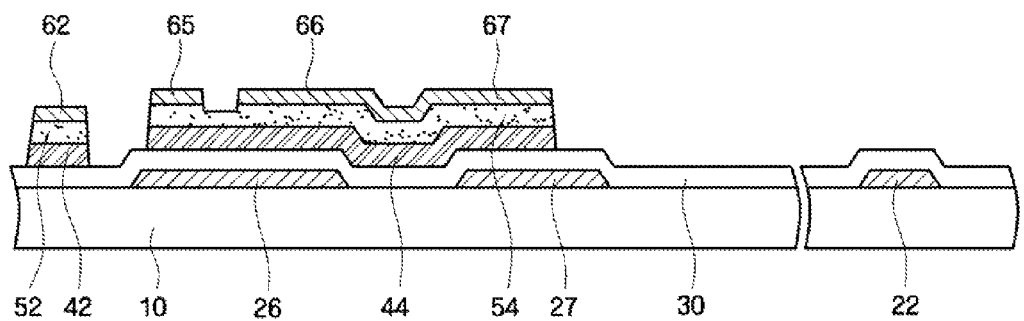

Referring to FIG. 11 and FIG. 12, the photoresist layer pattern 1012 remaining on the data interconnections (62, 65, 66, and 67) is removed, for example, by ashing.

Figure 13:
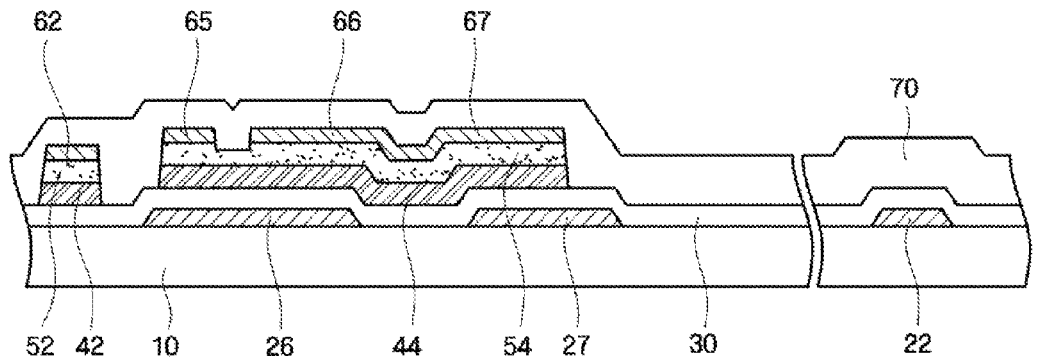

Referring to FIG. 12 and FIG. 13, a passivation layer 70 is formed on the second oxide semiconductor patterns (52 and 54), the data interconnections (62, 65, 66, and 67), and exposed portions of the gate insulating layer 30. The passivation layer 70 may be formed using the same material as the gate insulating layer 30 and by the same method.

Figure 14:
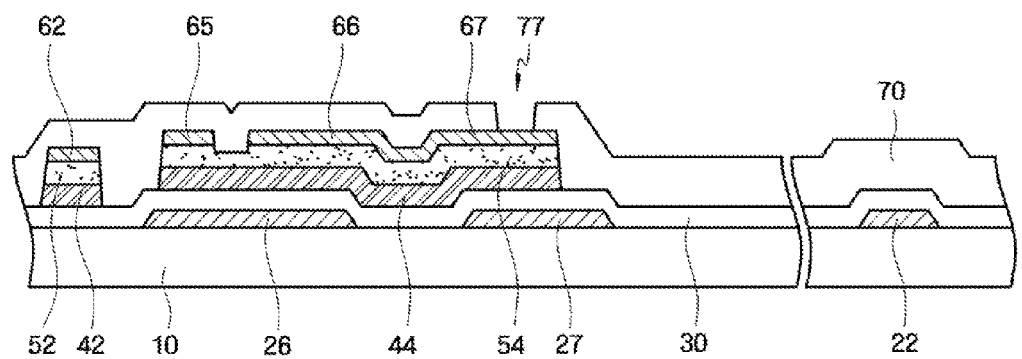

Next, as shown in FIG. 14, photolithography is performed on the passivation layer 70, thereby forming a contact hole 77 through which the drain electrode expansion 67 is exposed.

Finally, a transparent conductive material such as ITO or IZO may be deposited and etched by photolithography in order to form a pixel electrode 82, which is connected to the drain electrode expansion 67, thereby completing the display substrate shown in FIG. 2A.

Next, a method of fabricating the display substrate according to the first modified exemplary embodiment of the present invention will be described. For sake of clarity and ease of explanation, components having the same function in multiple drawings for describing the first exemplary embodiment are identified by the same reference numerals, and their repetitive description will be omitted.

Figure 15:
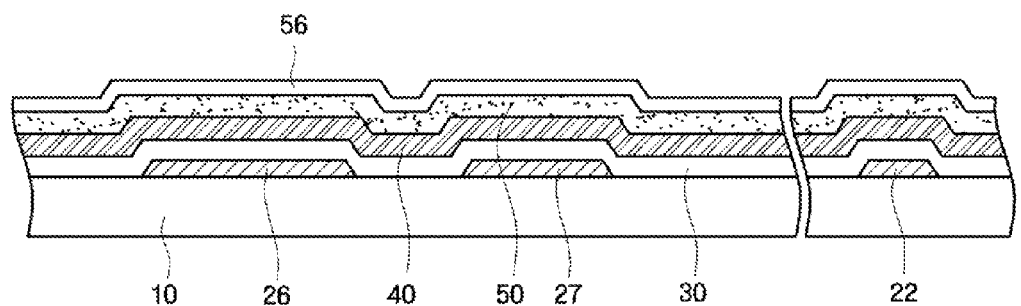
FIGS. 15, FIG. 16, FIG. 17, FIG. 18, FIG. 19, FIG. 20, FIG. 21, FIG. 22, FIG. 23, and FIG. 24 are cross-sectional views showing processing steps in a method of fabricating the display substrate according to the first modified exemplary embodiment of the present invention.

First, referring to FIG. 2B and FIG. 15, an etch stop layer 56 is formed on a second oxide semiconductor layer 50. The etch stop layer 56 is deposited by, for example, a PECVD method or a reactive sputtering method. The etch stop layer 56 made be of silicon nitride (SiNx), silicon oxide (SiOx), silicon oxynitride (SiON), or silicon oxycarbide (SiOC) and may be formed by PECVD.

Figure 16:
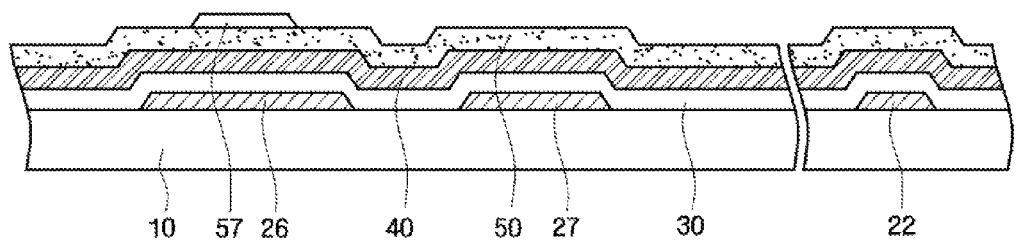
Figure 17:
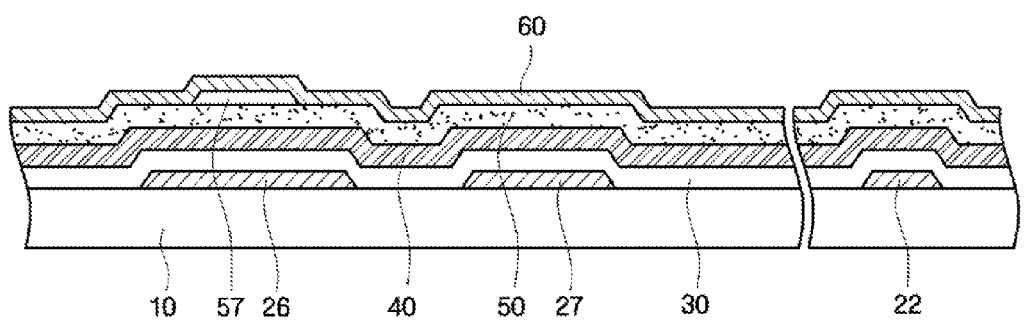
Figure 18:
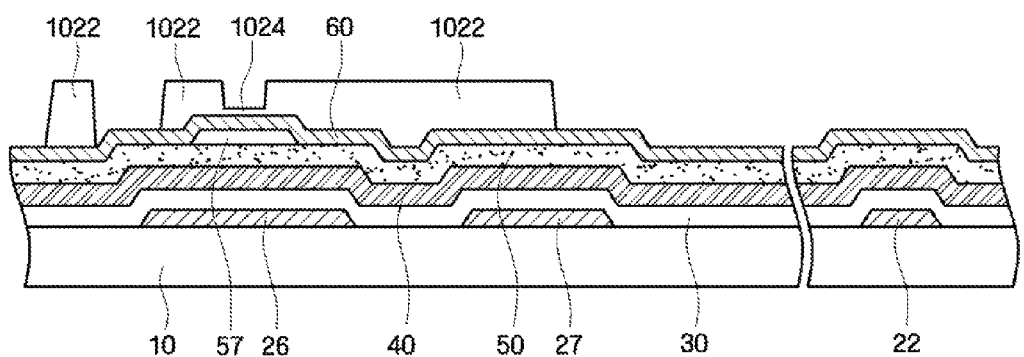
Figure 19:
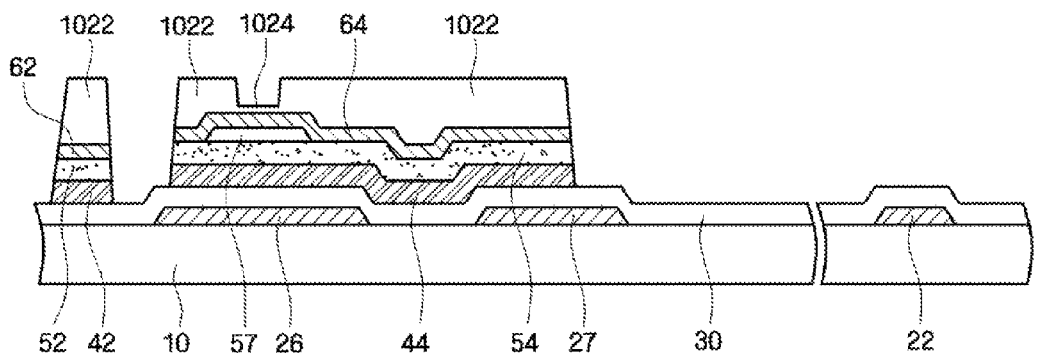
Figure 20:
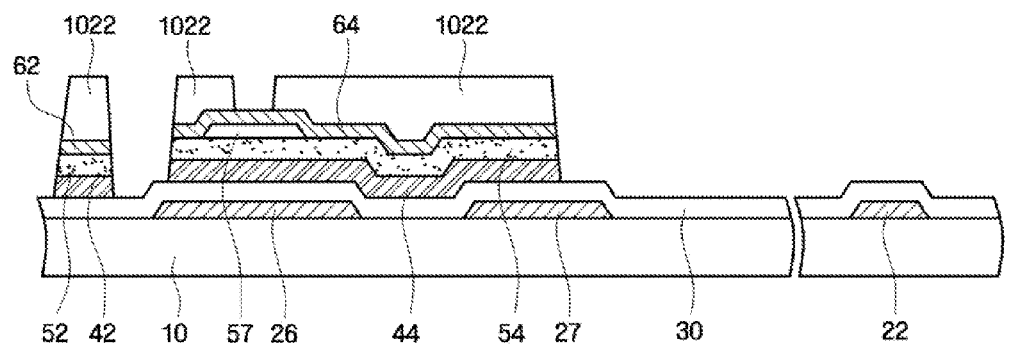
Figure 21:
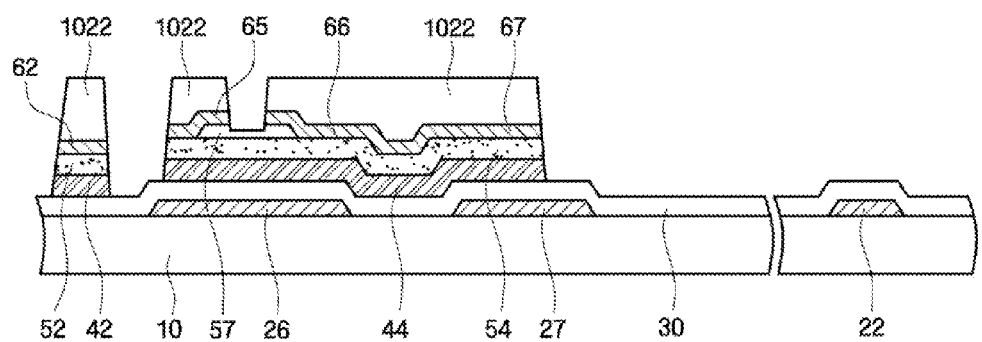
Figure 22:
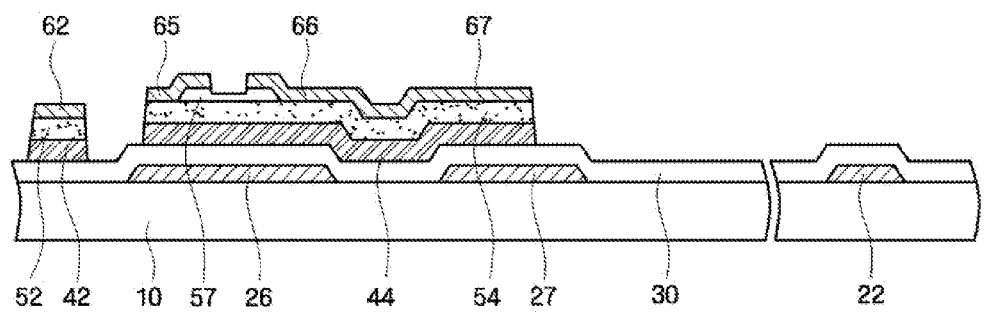

Next, referring to FIG. 2B and FIG. 16, photolithography may be performed on the etch stop layer 56, thereby forming an etch stop pattern 57. The etch stop pattern 57 is formed in a channel portion of the second oxide semiconductor pattern 54, which, in part, corresponds to the second oxide semiconductor layer 50. Accordingly, the presence of etch stop pattern 57 may prevent a portion of the channel of the second oxide semiconductor pattern 54 from being etched when the source electrode 65 and the drain electrode 66 are formed.

Subsequently, referring to FIG. 17, FIG. 18, FIG. 19, FIG. 20, FIG. 21, and FIG. 22, the first oxide semiconductor patterns (42 and 44), the second oxide semiconductor patterns (52 and 54), and data interconnections (62, 65, 66, and 67) may be formed in substantially the same manner as the method of fabricating the display substrate 101 according to the first exemplary embodiment. Here, the source electrode 65 and the drain electrode 66 in the data interconnections (62, 65, 66, 67) are spaced apart from and face each other. In addition, the source electrode 65 and the drain electrode 66 expose the etch stop pattern 57.

Figure 23:
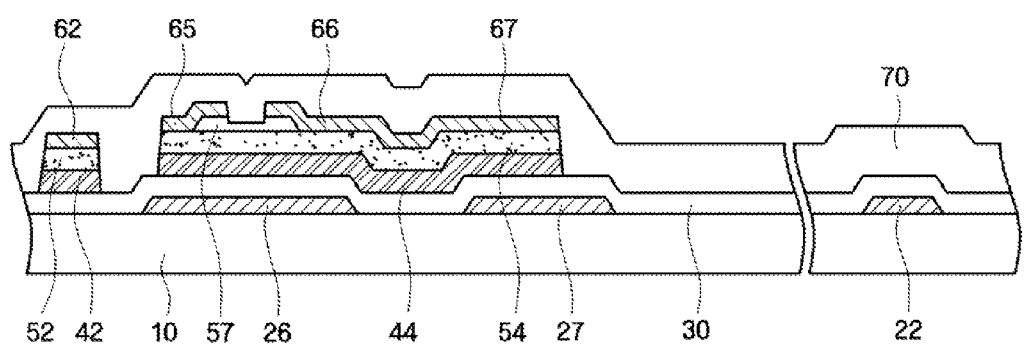
Figure 24:
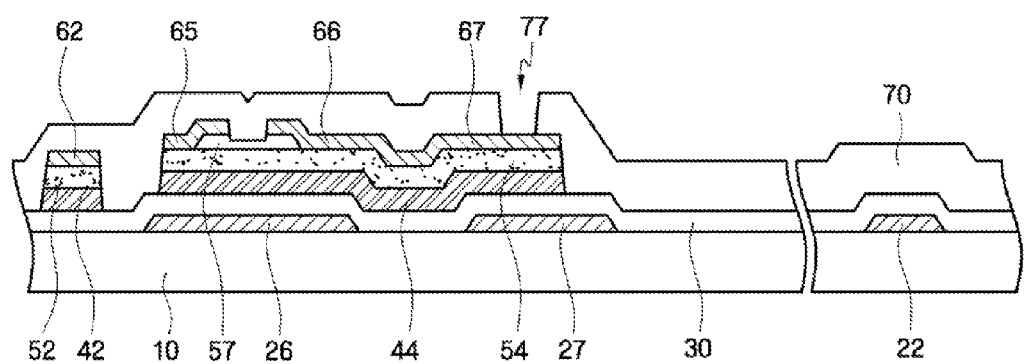

Referring to FIG. 23 and FIG. 24, a passivation layer 70 may be formed on the second oxide semiconductor patterns (52 and 54), the data interconnections (62, 65, 66, and 67), and the gate insulation layer 30 in substantially the same manner as the method of fabricating the display substrate according to the first exemplary embodiment. In addition, photolithography may be performed on the passivation layer 70, thereby forming a contact hole 77 through which the drain electrode expansion 67 is exposed.

Finally, a transparent conductive material such as ITO or IZO is deposited and etched by photolithography to form a pixel electrode 82, which is connected to the drain electrode expansion 67 through contact hole 77, thereby completing the display substrate shown in FIG. 2B.

Figure 25A:
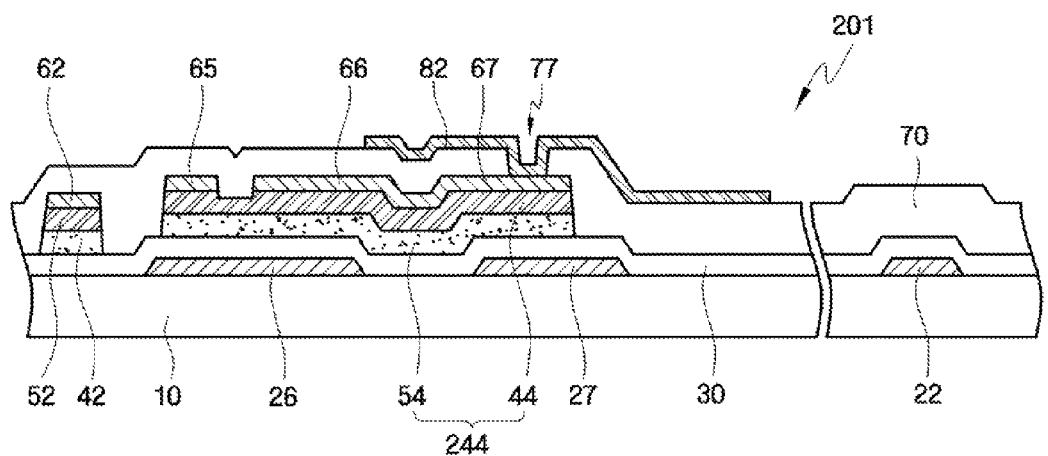
FIG. 25A is a cross-sectional view of a display substrate taken along line A-A' of FIG. 1 according to a second exemplary embodiment of the present invention.
Figure 25B:
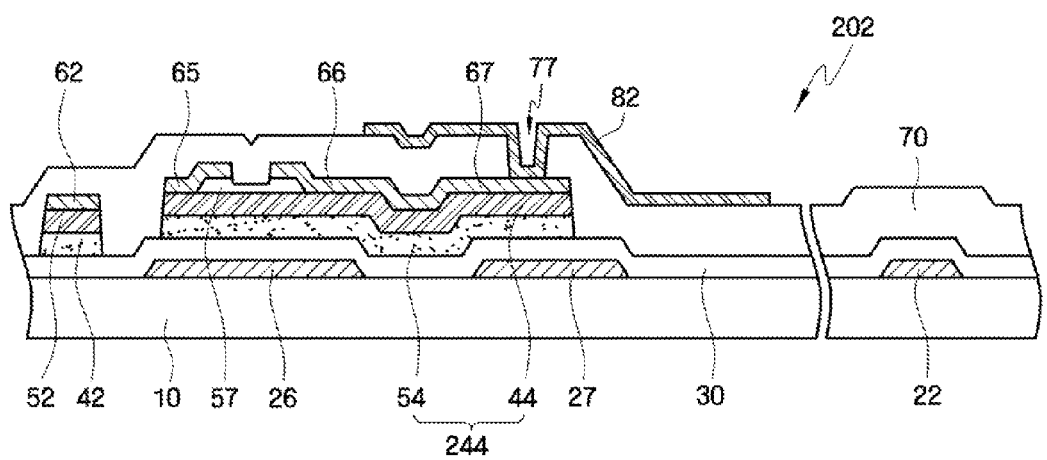
FIG. 25B is a cross-sectional view of a display substrate taken along line A-A' of FIG. 1 according to a second modified exemplary embodiment of the present invention.

Hereinafter, display substrates according to a second exemplary embodiment and a second modified exemplary embodiment of the present invention will be described with reference to FIG. 1, FIG. 25A, and FIG. 25B. FIG. 25A is a cross-sectional view of a display substrate taken along line A-A' of FIG. 1 according to a second exemplary embodiment of the present invention, and FIG. 25B is a cross-section view of a display substrate taken along line A-A' of FIG. 1 according to a second modified exemplary embodiment of the present invention. For sake of clarity and ease of explanation, components having the same function in multiple drawings for describing the first exemplary embodiment are identified by the same reference numerals, and their repetitive description will be omitted.

The display substrate 201 according to the second exemplary embodiment shown in FIG. 25A, has substantially the same configuration as the display substrate according to the first exemplary embodiment except for the following.

That is, in the display substrate 201 according to the second exemplary embodiment shown in FIG. 25A, a second oxide semiconductor pattern 54 is disposed on a gate line 26, and a first oxide semiconductor pattern 44 is disposed on the second oxide semiconductor pattern 54. Accordingly, the first oxide semiconductor pattern 44 can prevent light incident from a channel layer from entering the second oxide semiconductor pattern 54. As in the first exemplary embodiment, the light may have a wavelength in a range between 400 nm and 500 nm.

Meanwhile, the display substrate 202 according to the second modified exemplary embodiment shown in FIG. 25B has substantially the same configuration as the display substrate according to the first modified exemplary embodiment except for the following.

That is, in the display substrate 202 according to the second modified exemplary embodiment shown in FIG. 25B, a second oxide semiconductor pattern 54 is disposed on a gate line 26, and a first oxide semiconductor pattern 44 is disposed on the second oxide semiconductor pattern 54. Accordingly, the first oxide semiconductor pattern 44 can prevent light incident from a channel layer from entering the second oxide semiconductor pattern 54. As in the first exemplary embodiment, the light may have a wavelength in a range between 400 nm and 500 nm.

Figure 26A:
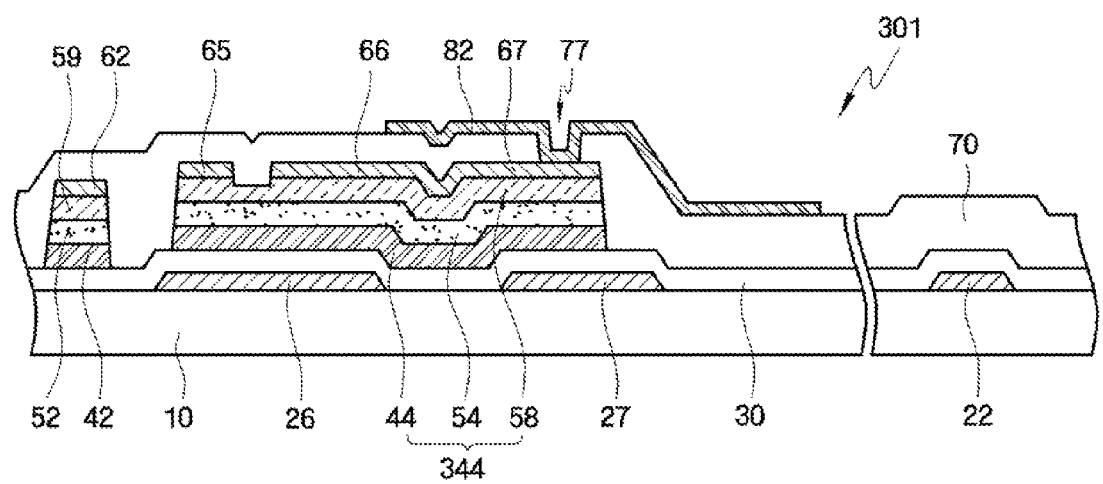
FIG. 26A is a cross-sectional view of a display substrate taken along line A-A' of FIG. 1 according to a third exemplary embodiment of the present invention.
Figure 26B:
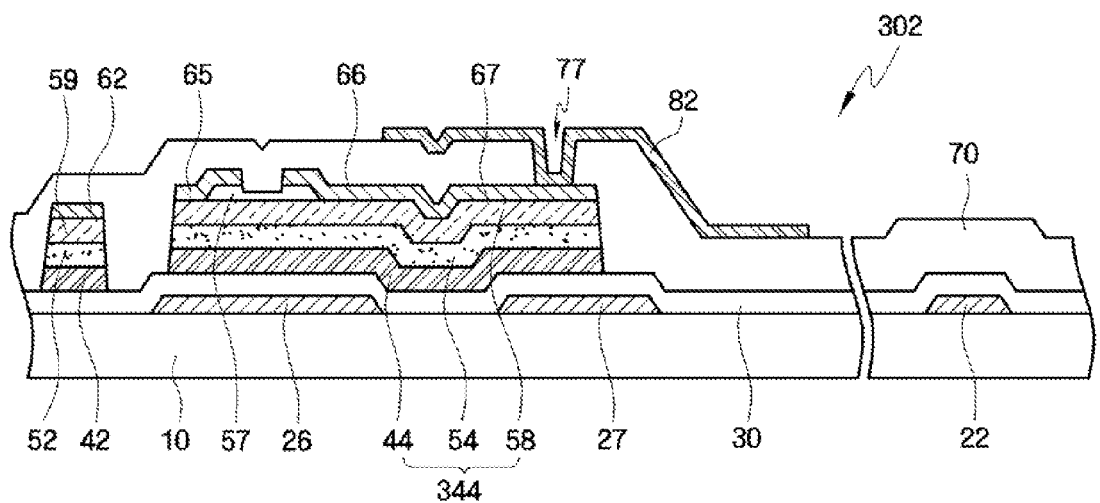
FIG. 26B is a cross-sectional view of a display substrate taken along line A-A' of FIG. 1 according to a third modified exemplary embodiment of the present invention.

Hereinafter, display substrates according to a third exemplary embodiment and a third modified exemplary embodiment of the present invention will be described with reference to FIG. 1, FIG. 26A, and FIG. and 26B. FIG. 26A is a cross-sectional view of a display substrate taken along line A-A' of FIG. 1 according to a third exemplary embodiment of the present invention, and FIG. 26B is a cross-section view of a display substrate taken along line A-A' of FIG. 1 according to a third modified exemplary embodiment of the present invention. For sake of clarity and ease of explanation, components having the same function in multiple drawings for describing the first exemplary embodiment are identified by the same reference numerals, and their repetitive description will be omitted.

The display substrate 301 according to the third exemplary embodiment shown in FIG. 26A has substantially the same configuration as the display substrate according to the first exemplary embodiment except for the following.

That is, in the display substrate 301 according to the third exemplary embodiment shown in FIG. 26A, an oxide semiconductor pattern 344 includes a first oxide semiconductor pattern 44, a second oxide semiconductor pattern 54, and a third oxide semiconductor pattern 58. Here, the first oxide semiconductor pattern 44 is disposed on a gate line 26; the second oxide semiconductor pattern 54 is disposed on the first oxide semiconductor pattern 44, and the third oxide semiconductor pattern 58 is disposed on the second oxide semiconductor pattern 54.

Here, the third oxide semiconductor pattern 58 may be formed by substantially the same method using substantially the same material as for the first oxide semiconductor pattern 44.

According to the third exemplary embodiment of the present invention, the first oxide semiconductor pattern 44 may prevent light incident from a side of the gate line 26 from entering the second oxide semiconductor pattern 54. In addition, the third oxide semiconductor pattern 58 can prevent light incident from a channel layer from entering the second oxide semiconductor pattern 54. As in the first exemplary embodiment, the light may have a wavelength in a range between 400 nm and 500 nm.

Meanwhile, a display substrate 302 according to the third modified exemplary embodiment shown in FIG. 26B has substantially the same configuration as the display substrate 301 according to the third exemplary embodiment except that an etch stop pattern 57 is formed on an oxide semiconductor pattern 344. The etch stop pattern 57 of the third modified exemplary embodiment is substantially the same as the etch stop pattern 57 of the first modified exemplary embodiment, and its repetitive description will be omitted.

Figure 27A:
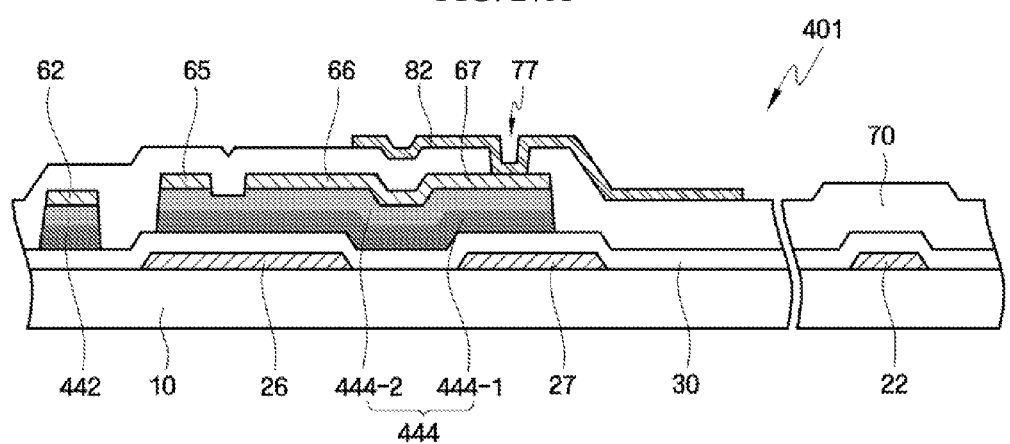
FIG. 27A is a cross-sectional view of a display substrate taken along line A-A' of FIG. 1 according to a fourth exemplary embodiment of the present invention.
Figure 27B:
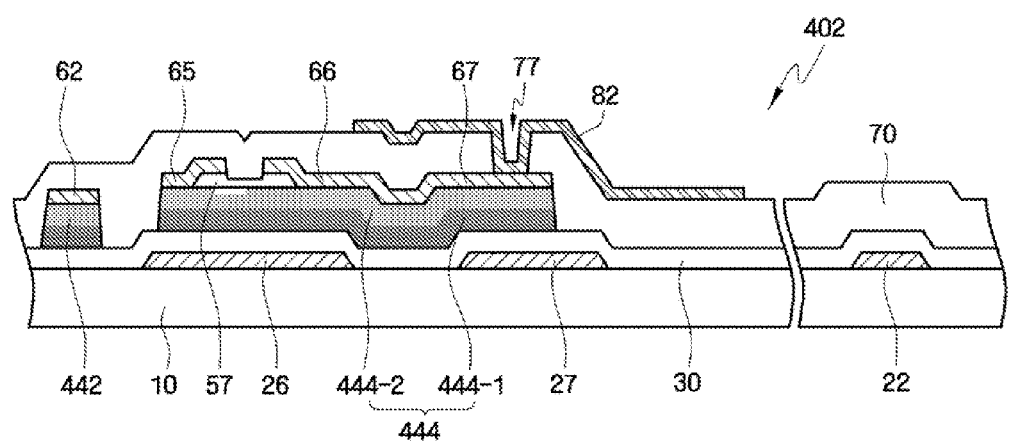
FIG. 27B is a cross-sectional view of a display substrate taken along line A-A' of FIG. 1 according to a fourth modified exemplary embodiment of the present invention.

Hereinafter, display substrates according to a fourth exemplary embodiment and a fourth modified exemplary embodiment of the present invention will be described with reference to FIG. 1, FIG. 27A, and FIG. 27B. FIG. 27A is a cross-sectional view of a display substrate taken along line A-A' of FIG. 1 according to a fourth exemplary embodiment of the present invention, and FIG. 27B is a cross-sectional view of a display substrate taken along line A-A' of FIG. 1 according to a fourth modified exemplary embodiment of the present invention. For sake of clarity and ease of explanation, components having the same function in multiple drawings for describing the first exemplary embodiment are identified by the same reference numerals, and their repetitive description will be omitted.

The display substrate 401 according to the fourth exemplary embodiment shown in FIG. 27A has substantially the same configuration as the display substrate 101 according to the first exemplary embodiment except for the following.

That is, in the display substrate 401 according to the fourth exemplary embodiment shown in FIG. 27A, an oxide semiconductor pattern 444 includes a first oxide and a third element of the periodic table. Here, the first oxide and the third element are substantially the same as those of the first exemplary embodiment, and their repetitive description will be omitted.

The third element has a concentration gradient varying in a vertical direction with respect to the oxide semiconductor pattern 444. Accordingly, the oxide semiconductor pattern 444 may include a first portion 444-1 with a relatively high concentration of the third element and a second portion 444-2 with a relatively low concentration of the third element. Therefore, the first portion 444-1 has characteristics similar to those of the first oxide semiconductor pattern 44 of the first exemplary embodiment, while the second portion 444-2 has characteristics similar to those of the second oxide semiconductor pattern 54 of the first exemplary embodiment. That is, the first portion 444-1 has a greater band gap than the second portion 444-2. In addition, the first portion 444-1 has lower transmittance of light in a wavelength range between 400 nm and 500 nm than the second portion 444-2. Further, the first portion 444-1 and the second portion 444-2 may be continuously formed in the oxide semiconductor pattern 444.

In the display substrate 401 according to the fourth exemplary embodiment of the present invention, the first portion 444-1 may be formed adjacent to a gate line 26. The farther from the gate line 26 that the first portion 444-1 is disposed, the smaller the concentration of the third element included in the oxide semiconductor pattern 444. Accordingly, the first portion 444-1 can prevent light incident from the opposing side of the gate line 26 from entering the second portion 444-2. Here, as described above in the first exemplary embodiment, the light may have a wavelength range between 400 nm and 500 nm.

Next, the display substrate 402 according to the fourth modified exemplary embodiment shown in FIG. 27B has substantially the same configuration as the display substrate 401 according to the fourth exemplary embodiment except that an etch stop pattern 57 is formed on an oxide semiconductor pattern 444. The etch stop pattern 57 of the fourth modified exemplary embodiment is substantially the same as the etch stop pattern 57 of the first modified exemplary embodiment, and their repetitive description will be omitted.

Figure 28A:
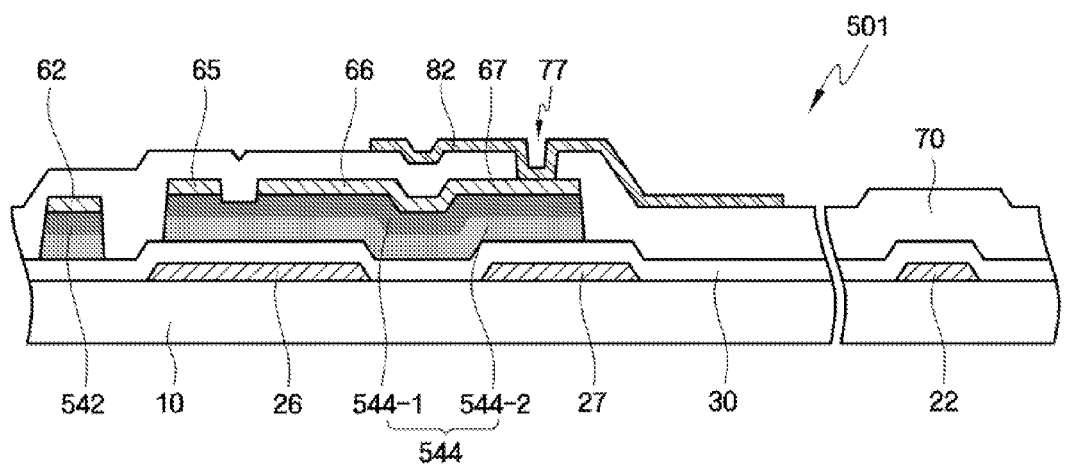
FIG. 28A is a cross-sectional view of a display substrate taken along line A-A' of FIG. 1 according to a fifth exemplary embodiment of the present invention.
Figure 28B:
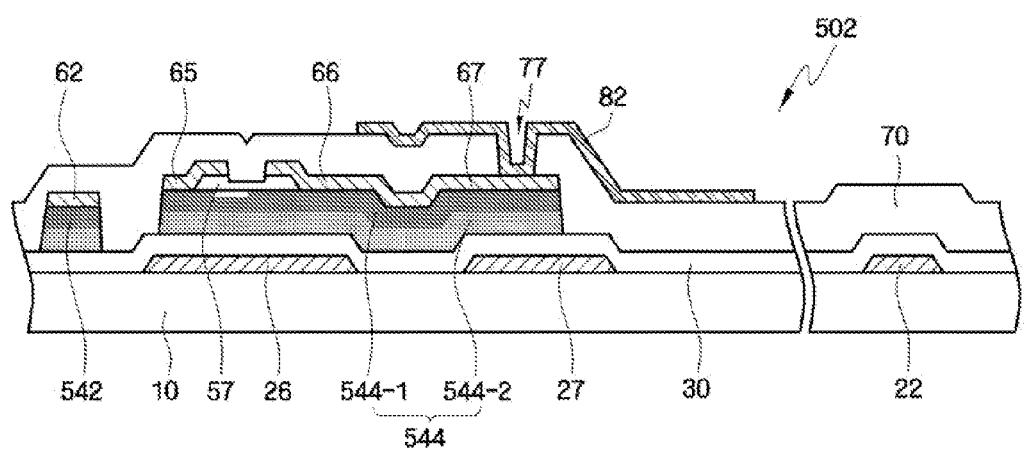
FIG. 28B is a cross-sectional view of a display substrate taken along line A-A' of FIG. 1 according to a fifth modified exemplary embodiment of the present invention.

Hereinafter, display substrates according to a fifth exemplary embodiment and a fifth modified exemplary embodiment of the present invention will be described with reference to FIG. 1, FIG. 28A, and FIG. 28B. FIG. 28A is a cross-sectional view of a display substrate taken along line A-A' of FIG. 1 according to a fifth exemplary embodiment of the present invention, and FIG. 28B is a cross-sectional view of a display substrate taken along line A-A' of FIG. 1 according to a fifth modified exemplary embodiment of the present invention. For sake of clarity and ease of explanation, components having the same function in multiple drawings for describing the first exemplary embodiment are respectively identified by the same reference numerals, and their repetitive description will be omitted.

The display substrate 501 according to the fifth exemplary embodiment shown in FIG. 28A has substantially the same configuration as the display substrate 401 according to the fourth exemplary embodiment except for the following.

That is, in the display substrate 501 according to the fifth exemplary embodiment shown in FIG. 28A, a second portion 544-2 of an oxide semiconductor pattern 544 may be formed adjacent to a gate line 26. In other words, the farther from the gate line 26 the second portion 544-2 is disposed, the smaller the concentration of the third element included in the oxide semiconductor pattern 544. Accordingly, a first portion 544-1 can prevent light incident from a channel layer from entering the second portion 544-2. Here, as described above in the first exemplary embodiment, the light may have a wavelength range between 400 nm and 500 nm.

Next, the display substrate 502 according to the fifth modified exemplary embodiment shown in FIG. 28B has substantially the same configuration as the display substrate 501 according to the fifth exemplary embodiment except that an etch stop pattern 57 is formed on an oxide semiconductor pattern 544. In addition, the etch stop pattern 57 of the fifth modified exemplary embodiment may also be substantially the same as the etch stop pattern 57 of the fifth modified exemplary embodiment, and its repetitive description will be omitted.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display substrate, comprising:
   a gate interconnection disposed on a substrate;
   an oxide semiconductor pattern disposed on the gate interconnection and comprising:
      a first oxide semiconductor pattern comprising a first oxide and a first element; and
      a second oxide semiconductor pattern comprising a second oxide; and
   a data interconnection disposed on the oxide semiconductor pattern, wherein,
   the first oxide semiconductor pattern is disposed closer to the gate interconnection than the second oxide semiconductor pattern, and
   a band gap of the first oxide semiconductor pattern is greater than a band gap of the second oxide semiconductor pattern,
   wherein the first oxide semiconductor pattern comprises at least one element selected from the group consisting of gallium (Ga), indium (In), zinc (Zn), tin (Sn), and hafnium (Hf), and
   wherein the first element comprises at least one element selected from the group consisting of nitrogen (N), phosphorus (P), fluorine (F), and chlorine (Cl).

2. The display substrate of claim 1, wherein the first oxide semiconductor pattern blocks light comprising a wavelength in a range of 400 nm to 500 nm.

3. The display substrate of claim 1, wherein the gate interconnection comprises a gate electrode, and a turn-on voltage applied to the gate electrode is greater than or equal to 0 V.

4. The display substrate of claim 1, wherein the first element belongs to a group in the periodic table higher than a group of a metal included in the first oxide.

5. The display substrate of claim 4, wherein the first element comprises a Group V-VII element of the periodic table.

6. The display substrate of claim 1, wherein the first oxide semiconductor pattern blocks light incident into the second oxide semiconductor pattern, the light comprising a wavelength in a range of 400 nm to 500 nm.

7. The display substrate of claim 1, wherein the first oxide semiconductor pattern and the second oxide semiconductor pattern comprise metallic elements of the same group of the periodic table.

8. The display substrate of claim 1, wherein the first oxide and the second oxide comprise metallic elements of different groups of the periodic table.

9. The display substrate of claim 1, further comprising an etch stop pattern disposed on the oxide semiconductor pattern.

10. The display substrate of claim 9, wherein the data interconnection comprises a source electrode and a drain electrode spaced apart from and facing each other, and the etch stop pattern is disposed between the source electrode and the drain electrode.

* * * * *